(12) United States Patent
Oh et al.

(10) Patent No.: US 9,274,721 B2
(45) Date of Patent: Mar. 1, 2016

(54) NONVOLATILE MEMORY DEVICE AND DATA MANAGEMENT METHOD THEREOF

(71) Applicants: Eun Chu Oh, Hwaseong-si (KR); Junjin Kong, Yongin-si (KR); Hong Rak Son, Anyang-si (KR); Younggeon Yoo, Seoul (KR)

(72) Inventors: Eun Chu Oh, Hwaseong-si (KR); Junjin Kong, Yongin-si (KR); Hong Rak Son, Anyang-si (KR); Younggeon Yoo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 79 days.

(21) Appl. No.: 14/206,269

(22) Filed: Mar. 12, 2014

(65) Prior Publication Data

US 2014/0281279 A1    Sep. 18, 2014

(30) Foreign Application Priority Data

Mar. 15, 2013    (KR) .................. 10-2013-0028047

(51) Int. Cl.
*G06F 3/06*    (2006.01)

(52) U.S. Cl.
CPC ............ *G06F 3/0655* (2013.01); *G06F 3/0604* (2013.01); *G06F 3/0679* (2013.01)

(58) Field of Classification Search
CPC ......... G11C 16/28; G11C 7/14; G06F 3/0655
See application file for complete search history.

(56) References Cited

U.S. PATENT DOCUMENTS

| | | | |
|---|---|---|---|
| 6,982,908 B2 | 1/2006 | Cho | |
| 7,499,314 B2 | 3/2009 | Yang et al. | |
| 7,830,705 B2 | 11/2010 | Jeong | |
| 8,189,363 B2 | 5/2012 | Tsuchida et al. | |
| 8,321,623 B2 | 11/2012 | Murin et al. | |
| 2004/0022097 A1 | 2/2004 | Cho | |
| 2008/0094884 A1 | 4/2008 | Yang et al. | |
| 2009/0016100 A1 | 1/2009 | Jeong | |
| 2009/0319722 A1* | 12/2009 | Murin et al. | 711/103 |
| 2010/0046274 A1 | 2/2010 | Tsuchida et al. | |
| 2010/0061141 A1 | 3/2010 | Hwang | |
| 2011/0235402 A1* | 9/2011 | Ueda | 365/148 |
| 2012/0218813 A1 | 8/2012 | Oh et al. | |
| 2013/0064008 A1* | 3/2013 | Kim et al. | 365/158 |

FOREIGN PATENT DOCUMENTS

| | | |
|---|---|---|
| JP | 2000315383 A | 11/2000 |
| JP | 2009200123 A | 9/2009 |
| KR | 20050097121 A | 10/2005 |
| KR | 20100028932 A | 3/2010 |
| KR | 20120097790 A | 9/2012 |

* cited by examiner

*Primary Examiner* — Idriss N Alrobaye
*Assistant Examiner* — Ronald Modo
(74) *Attorney, Agent, or Firm* — Harness, Dickey & Pierce, P.L.C.

(57)    ABSTRACT

A data management method of a nonvolatile memory device which includes a data cell area and a reference cell area includes selecting shared data from write data input to the memory device; generating reference data based on the shared data; and storing the write data in the data cell area and a first reference area of the reference cell area; and storing the reference data in a second reference area of the reference cell area.

20 Claims, 22 Drawing Sheets

Fig. 5

| W_Data | | | R_Data | | EW_Data | | | |
|---|---|---|---|---|---|---|---|---|
| d2 | d1 | d0 | r1 | r0 | d2 | d1 | r1 / d0 | r0 |
| 0 | 0 | 0 | x | x | 0 | 0 | 0 | 1 |
| 0 | 0 | 1 | x | x | 0 | 0 | 1 | 0 |
| 0 | 1 | 0 | x | x | 0 | 1 | 0 | 1 |
| 0 | 1 | 1 | x | x | 0 | 1 | 1 | 0 |
| 1 | 0 | 0 | x | x | 1 | 0 | 0 | 1 |
| 1 | 0 | 1 | x | x | 1 | 0 | 1 | 0 |
| 1 | 1 | 0 | x | x | 1 | 1 | 0 | 1 |
| 1 | 1 | 1 | x | x | 1 | 1 | 1 | 0 |

$r1=d0, r0=\overline{r1}$

Fig. 6

Fig. 10
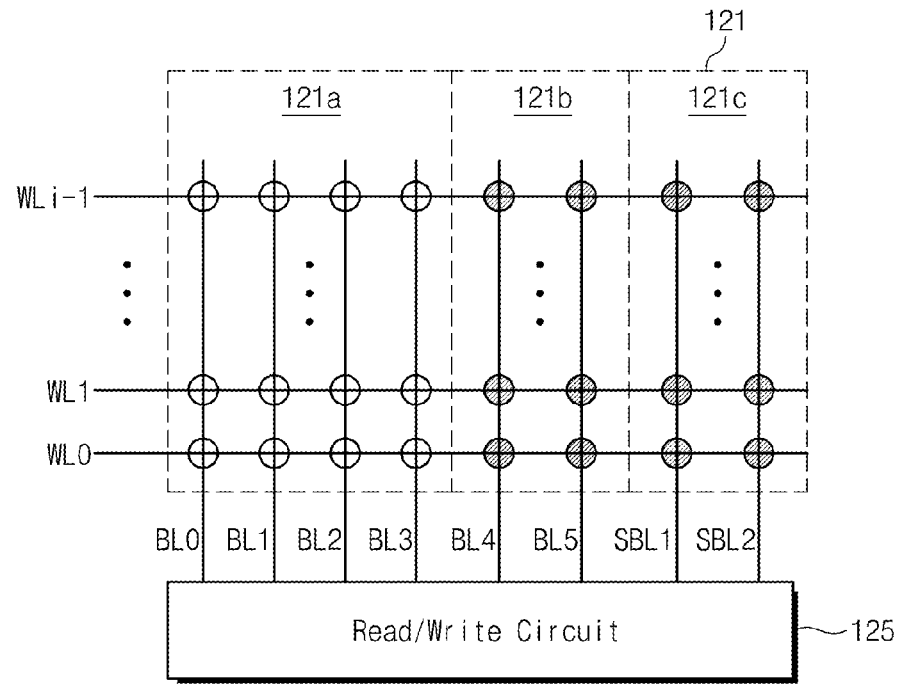
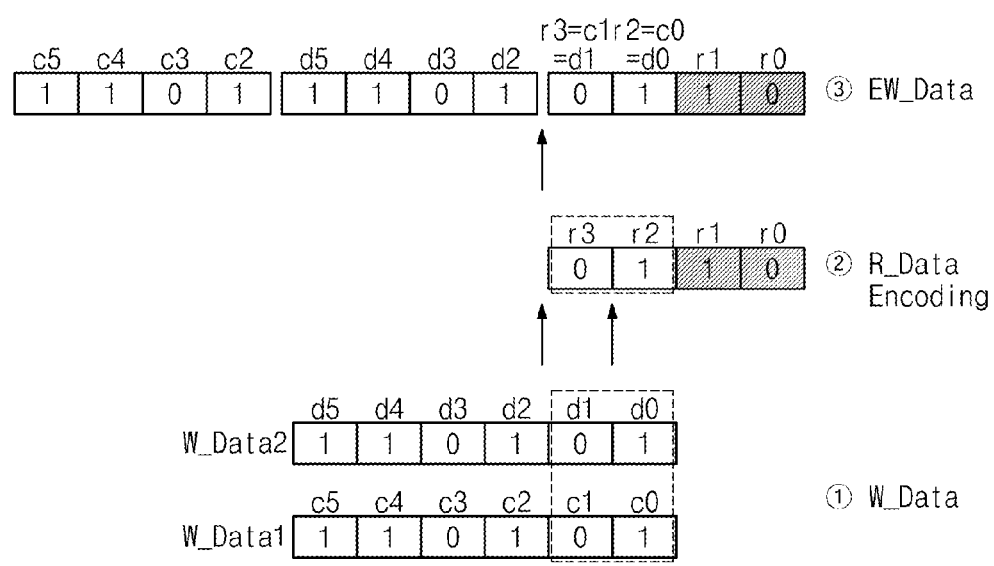

NONVOLATILE MEMORY DEVICE AND DATA MANAGEMENT METHOD THEREOF

CROSS-REFERENCE TO RELATED APPLICATIONS

A claim for priority under 35 U.S.C. §119 is made to Korean Patent Application No. 10-2013-0028047 filed Mar. 15, 2013, in the Korean Intellectual Property Office, the entire contents of which are hereby incorporated by reference.

BACKGROUND

The inventive concepts described herein relate to a semiconductor device, and more particularly, relate to a nonvolatile memory device including a reference cell and a data management method thereof.

Semiconductor memory devices are divided into voltage memory devices and nonvolatile memory devices. While read and write speeds of the volatile memory device are fast, volatile memory devices lose contents stored therein at power-off. On the other hand, the nonvolatile memory devices retain data stored therein even at power-off. Thus, the nonvolatile memory devices are used to store contents which must be retained regardless of whether a power is supplied.

A demand for high-integration and mass random access memory devices is increasing. A semiconductor memory device used for handheld electronic devices may be a flash memory device. But, there has been researched a random accessible nonvolatile element with an improved performance. For example, there have been researched a ferroelectric RAM (FRAM) using a ferroelectric capacitor, a magnetic RAM (MRAM) using a tunneling magneto-resistive (TRM) film, a phase change memory device using a Chalcogenide alloys, a resistive RAM (RRAM) using a variable resistance material as a data storage medium, etc.

The above-described nonvolatile memories may include a reference cell for discriminating data stored in memory cells. More reference cells may be required for high data integrity. However, an increase in the number of reference cells may hinder implementation of high-integration, light and slim nonvolatile memories. Thus, is provided a technique for providing high data integrity without increasing the number of reference cells.

SUMMARY

One or more example embodiments of the inventive concepts are directed to provide a data management method of a nonvolatile memory device which includes a data cell area and a reference cell area is provided. The data management method includes receiving write data; selecting shared data of the write data as data to be stored in a first reference area of the reference cell area; generating reference data to be stored in a second reference area of the reference cell area, based on the shared data; and storing the write data in the data cell area and the first reference area and the reference data in the second reference area.

Other example embodiments of the inventive concepts are directed to provide a data management method of a nonvolatile memory device which includes a data cell area and a reference cell area. The data management method includes receiving write data; selecting shared data of the write data as data to be stored in the reference cell area; and storing the write data in the data cell area and the reference cell area, wherein the number of bits of the write data is equal to a sum of the number of memory cells of the data cell area and the number of memory cells of the reference cell area.

At least one example embodiment relates to a method for managing data of a memory device.

In at least one example embodiment, the method includes receiving, at the memory device, an instruction from a memory controller instructing the memory device to store write data therein; and storing the write data in the memory cell such that a portion of the write data, stored in a shared cell area of the memory device, represents both the received write data and reference data.

In at least one example embodiment, the method further includes reading the write data from the memory device; and determining a logical level of the write data based on an amount of current flowing through the shared cell area having the reference data stored therein.

In at least one example embodiment, at least two bits stored in the shared cell represent both the write data received from the memory controller and the reference data used to determine the logical level of the write data.

In at least one example embodiment, the storing the portion of the write data in the shared cell includes selecting a number of least significant bits of the write data corresponding to a size of the shared cell area as test reference data; and generating the reference data from the test reference data such that logical values stored therein satisfy a desired condition.

In at least one example embodiment, the method further includes generating a reference signal from the reference data by providing the reference data to an averaging circuit; and determining a logical level of the write data by comparing, using a sense amplifier, a voltage level of the reference signal and a voltage level associated with the write data.

BRIEF DESCRIPTION OF THE FIGURES

The above and other objects and features will become apparent from the following description with reference to the following figures, wherein like reference numerals refer to like parts throughout the various figures unless otherwise specified, and wherein

FIGS. 5 and 6 show true tables for describing an example embodiment of FIG. 4;

FIG. 10 is a block diagram schematically illustrating a data writing method according to another embodiment of the inventive concepts;

DETAILED DESCRIPTION

Figure 1:
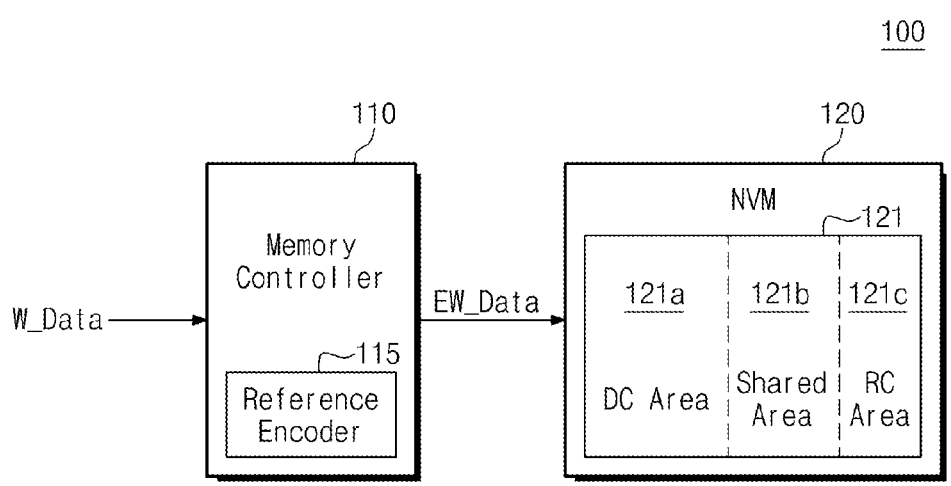
FIG. 1 is a block diagram schematically illustrating a memory system according to an example embodiment of the inventive concepts.

Example embodiments will be described in detail with reference to the accompanying drawings. The inventive concepts, however, may be embodied in various different forms, and should not be construed as being limited only to the illustrated embodiments. Rather, these example embodiments are provided as examples so that this disclosure will be thorough and complete, and will fully convey the inventive concepts to those skilled in the art. Accordingly, known processes, elements, and techniques are not described with respect to some of the example embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular example embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, features and functions of the inventive concepts will be described using a Spin Transfer Torque Magnetoresistive Random Access Memory (STT-MRAM) as a semiconductor device. However, the inventive concepts are not limited thereto. The inventive concepts may be implemented by different embodiments or applied thereto. Further, detailed description may be modified or changed according to viewpoints and applications without escaping from the scope, spirit and other objects of the inventive concepts.

FIG. 1 is a block diagram schematically illustrating a memory system according to an example embodiment of the inventive concepts.

Referring to FIG. 1, a memory system 100 according to an example embodiment of the inventive concepts includes a memory controller 110 and a nonvolatile memory device 120.

The memory controller 110 controls the nonvolatile memory device 120 in response to an external command. The memory controller 110 encodes write data W_Data provided from an external device. The memory controller 110 provides the encoded write data EW_Data to the nonvolatile memory device 120. The memory controller 110 controls the nonvolatile memory device 120 such that the encoded write data EW_Data is programmed in a selected area. In particular, the memory controller 110 encodes input write data W_Data to generate data (hereinafter, referred to as reference data) to be stored in a reference cell. The memory controller 110 generates the encoded write data EW_Data by merging the input write data W_Data and the reference data R_Data generated from the write data W_Data.

The memory controller 110 includes a reference encoder 115 configured to convert the input write data W_Data into the encoded write data EW_Data. The reference encoder 115 generates the reference data R_Data based on a part of the write data W_Data. The write data W_Data may include data to be stored in a data cell array 121a of the nonvolatile memory device 120 and data to be stored in a shared area 121b thereof. The reference encoder 115 generates reference dedicated data RD_Data to be stored in a reference cell array 121c, based on shared data S_Data, to be stored in the shared area 121b, of the write data W_Data. Here, the shared data S_Data and the reference dedicated data RD_Data are referred to as the reference data R_Data. A reference data generating method of the reference encoder 115 will be more fully described below.

The reference encoder 115 encodes the write data W_Data to generate the encoded write data EW_Data including the reference data R_Data. The memory controller 110 controls the nonvolatile memory device 120 such that the encoded write data EW_Data is written in each area of a cell array 121. The memory controller 110 controls the nonvolatile memory device 120 such that write data W_Data, corresponding to a message portion, from among the encoded write data EW_Data is programmed in the data cell array 121a and the shared area 121b. The memory controller 110 controls the nonvolatile memory device 120 such that the reference dedicated data RD_Data of the encoded write data EW_Data is programmed in the reference cell array 121c.

The nonvolatile memory device 120 includes the cell array 121 where a plurality of memory cells is arranged in rows and columns. The cell array 121 includes the data cell area 121a, the shared area 121b and the reference cell area 121c. The data cell area 121a may be used to store the remaining portion of the encoded write data EW_Data other than the shared data S_Data and the reference dedicated data RD_Data. The shared area 121b may be used to store the shared data S_Data of the encoded write data EW_Data. The reference cell area 121c may be used to store the reference dedicated data RD_Data.

During a read operation, the nonvolatile memory device 120 accesses the shared and reference cell areas 121b and 121c of selected memory cells to generate a reference signal. The nonvolatile memory device 120 senses memory cells of the data cell area 121a and the shared area 121b based on the reference signal.

The nonvolatile memory device 120 according to an example embodiment of the inventive concepts includes reference cells (corresponding to the shared area 121b) where message bits are stored. Or, the nonvolatile memory device 120 may use memory cells storing data as reference cells. The memory system 100 encodes and stores data to be stored in the reference cell area 121c. Encoded reference dedicated data RD_Data stored in the reference cell area 121c may be decided according to a desired (or alternatively, a predetermined) rate of logical '1' to logical '0'. According to the memory system 100, the number of reference cells not storing a message bit is minimized, and high data integrity is provided.

Figure 2:
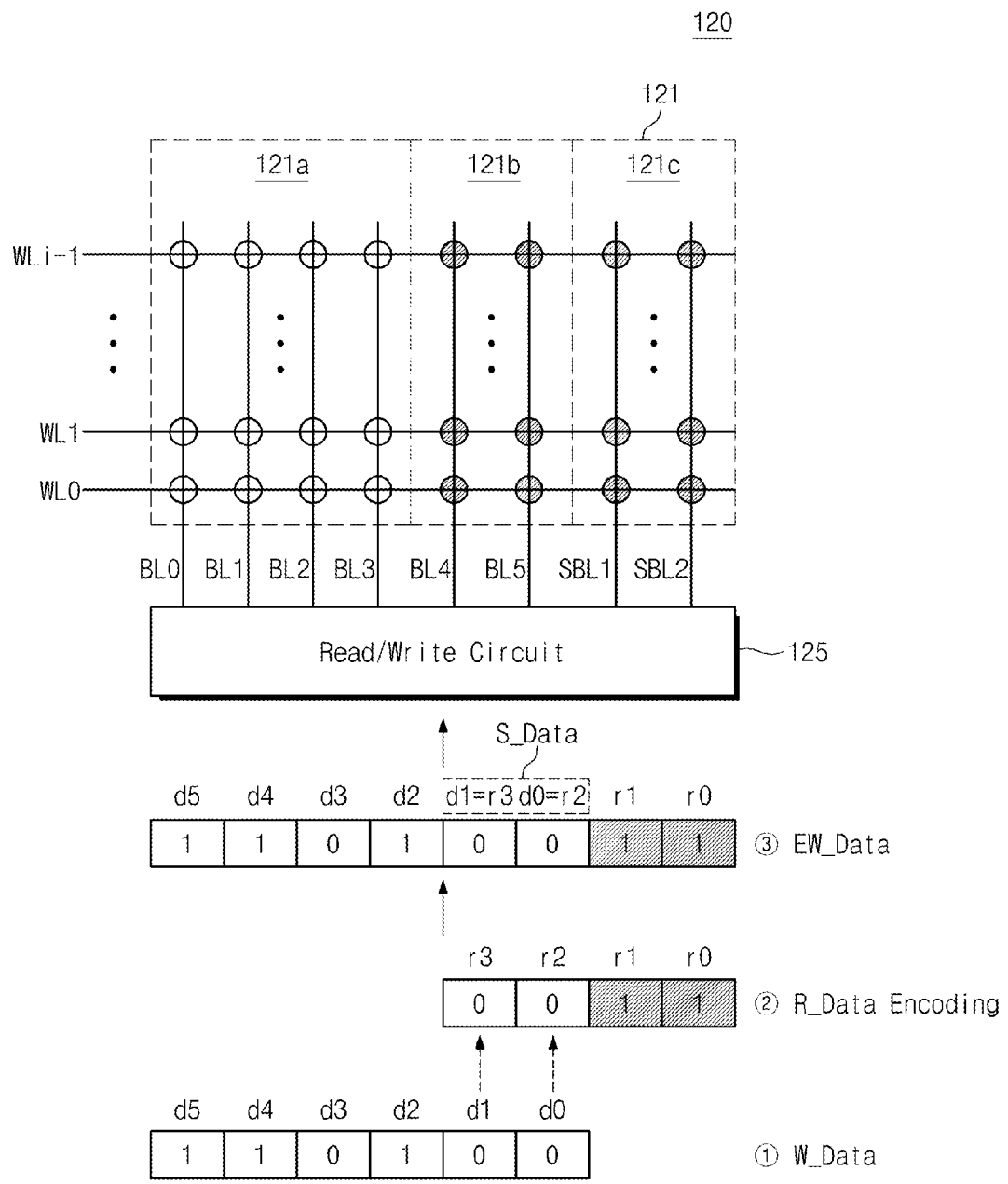
FIG. 2 is a block diagram schematically illustrating a data encoding operation of a memory system of FIG. 1, according to an example embodiment of the inventive concepts.

FIG. 2 is a block diagram schematically illustrating a data encoding operation of a memory system of FIG. 1, according to an example embodiment of the inventive concepts.

Referring to FIG. 2, the memory controller 110 generates reference dedicated data RD_Data based on shared data S_Data of write data W_Data. The shared data S_Data of the write data W_Data may be discriminated based on a column address.

In operation 1, the write data W_Data is provided to the memory controller 110. For example, it is assumed that the write data W_Data is 6-bit data of "110100". A shared area 121b where the shared data S_Data of the write data W_Data is to be written is formed of memory cells corresponding to bit lines BL4 and BL5. The data, to be stored in shared area 121b, of the write data W_Data may be "00" corresponding to "d1d0".

In operation 2, the reference dedicated data RD_Data to be stored in a reference cell area 121c is generated using the shared data S_Data. The reference dedicated data RD_Data of "11" (="r1r0") is generated from the shared data S_Data of "00" (="r3r2"). A reference dedicated data encoding method or algorithm may be implemented variously. For example, if the ratio of logical '1' and logical '0' on data of reference cells (included in the shared area 121b and the reference area 121c) is 1:1, the reference dedicated data RD_Data may be generated by inverting the shared data S_Data. However, the inventive concepts are not limited thereto. Memory cells in which the shared data S_Data and the reference dedicated data RD_Data are stored may be used as actual reference cells to generate a reference signal during a read operation.

In operation 3, if the reference dedicated data RD_Data is generated, encoded write data EW_Data is formed by merging the reference dedicated data RD_Data and the write data W_Data. The encoded write data EW_Data may be written in a selected area of a cell array 121 through a read/write circuit 125.

There is described an example embodiment in which data is stored in reference cells (e.g., cells in the shared area 121b). A part of the write data W_Data is stored in the shared area 121b formed of reference cells. The reference dedicated data RD_Data generated from data stored in the shared area 121b is stored in memory cells of the reference area 121c. It is possible to generate a reference signal using memory cells in the shared and reference areas 121b and 121c.

Figure 3:
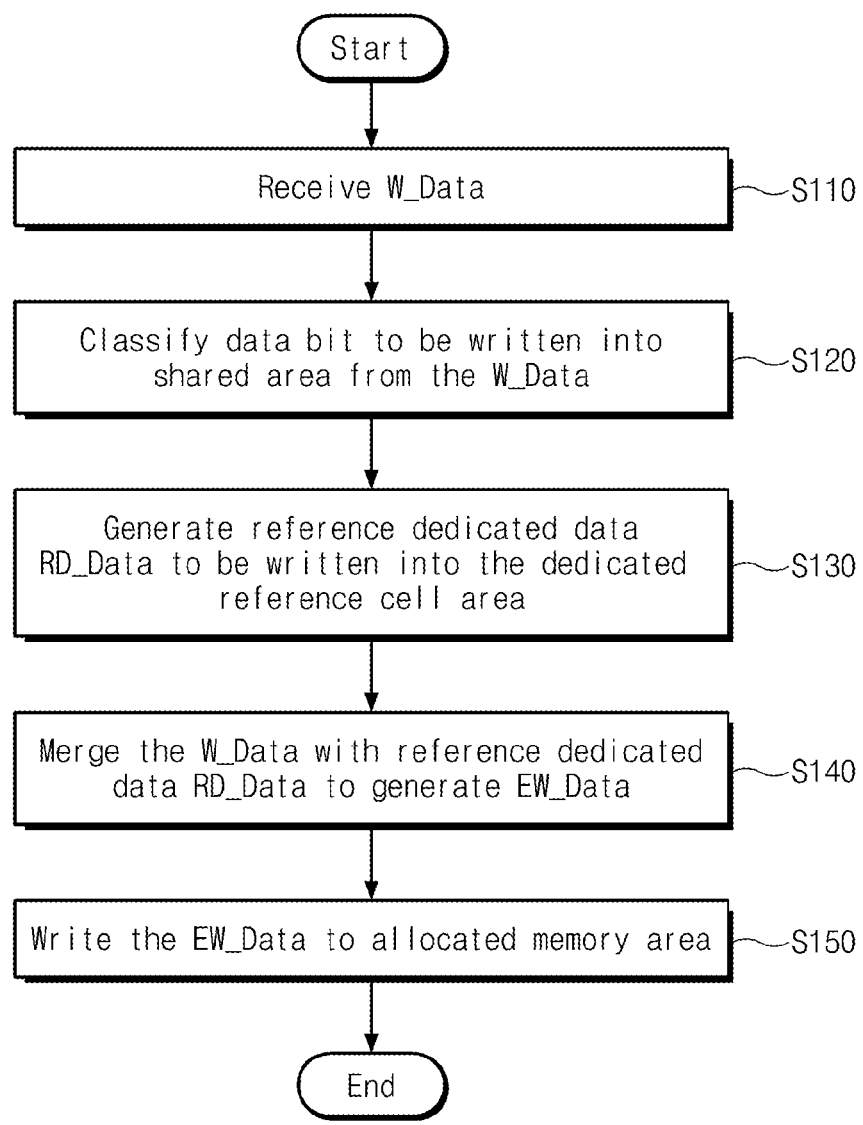
FIG. 3 is a flow chart schematically illustrating a write method of a nonvolatile memory device according to an example embodiment of the inventive concepts.

FIG. 3 is a flow chart schematically illustrating a write method of a nonvolatile memory device according to an example embodiment of the inventive concepts.

Referring to FIG. 3, a write operation may commence when write data W_Data is received from an external device or a host (not shown).

In operation S110, a memory controller 110 receives the write data W_Data. Here, various modifications and changes on the size and format of the write data W_Data may be made according to an interface with the external device.

In step S120, a reference encoder 115 selects shared data S_Data of the write data W_Data. The shared data S_Data may be selected from the write data W_Data based on column address information. The reference encoder 115 stores column address information of the shared area 121b of the cell array 121. The reference encoder 115 selects the shared data S_Data based on a column address corresponding to the shared area 121b.

In operation S130, the reference encoder 115 generates a reference dedicated data RD_Data based on the selected shared data S_Data. The reference dedicated data RD_Data may be an inverted version of the shared data S_Data. The reference dedicated data RD_Data may be generated by XORing the shared data S_Data and medium data formed of logical '1' bits the number of which is the same as that of the shared data S_Data.

In operation S140, the reference encoder 115 may merge the write data W_Data and the reference dedicated data RD_Data by adding the reference dedicated data RD_Data to the write data W_Data.

In step S150, the memory controller 110 writes the encoded write data EW_Data in the cell array 121. That is, the write data W_Data is stored in a data cell area 121a and the shared area 121*b*, and the reference dedicated data RD_Data is stored in the reference cell area 121*c*.

According to an example embodiment of the inventive concepts, data to be stored in a reference cell may be generated by encoding the write data W_Data. In addition, the shared area 121*b* of the cell array 121 in which the write data W_Data is stored may be used as a reference cell area during a read operation. Since the shared area 121*b* in which data is stored is used as a reference cell area, the number of reference cells required for data integrity is reduced.

In other words, message data may be stored in reference cells designated as the shared area 121*b*. Bit unbalance of reference cells in which message data is stored may be compensated by encoding of the reference dedicated data RD_Data to be stored in a reference cell array 121*c*.

Figure 4:
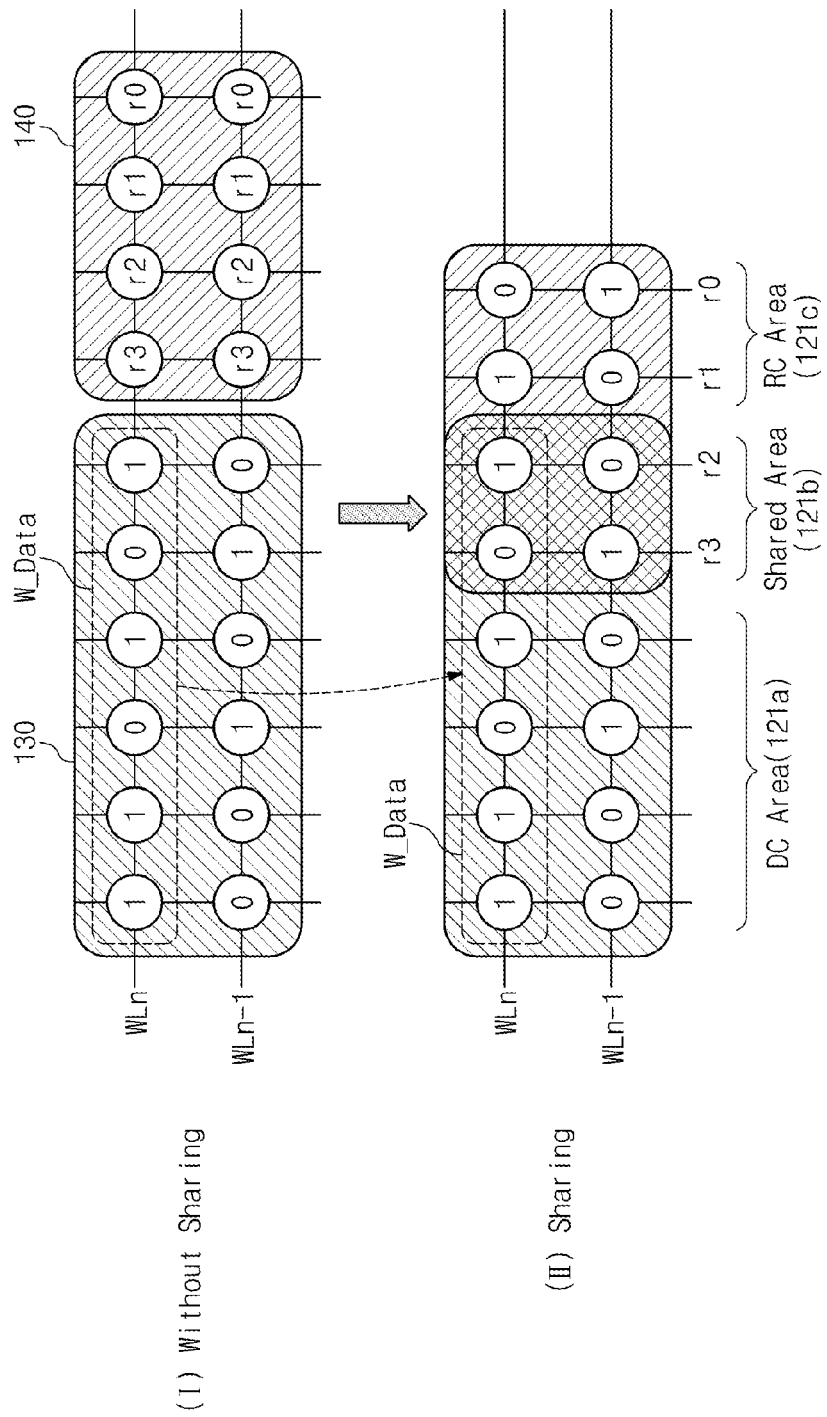
FIG. 4 is a diagram schematically illustrating a data writing method according to an example embodiment of the inventive concepts.

FIG. 4 is a diagram schematically illustrating a data writing method according to an example embodiment of the inventive concepts.

Referring to FIG. 4, a shared area 121*b* in which a part of write data W_Data is stored may have a data storage function and a reference cell function. In addition, if the shared area 121*b* takes charge of the reference cell function, the number of reference cells may be reduced.

Referring to a first case (I), there is shown an example in which a data area is not shared for a reference use. A cell array is divided into a data cell area 130 and a reference cell area 140. Write data W_Data of "110101" is stored in memory cells, included in the data cell area 130, from among memory cells connected to a word line WLn. Reference data of "r3r2r1r0" is stored in the reference cell area 140 connected to the word line WLn. Here, the reference data of "r3r2r1r0" is not related to the write data W_Data of "110101". The reference data of "r3r2r1r0" may be stored during a write operation on the data area 130. Or, the reference data of "r3r2r1 r0" may be set to fixed values.

Referring to a second case (II), there is illustrated an example embodiment in which a part of a data area is used as reference cells. Alternatively, it is comprehended that reference cells are used to store write data. When write data W_Data is received, a reference encoder 115 (refer to FIG. 1) selects shared data S_Data, to be stored in a shared area 121*b*, of the write data W_Data. Reference dedicated data RD_Data to be stored in a reference cell array 121*c* is generated based on the shared data S_Data to be stored in the shared area 121*b*. For example, write data W_Data of "110101" may be stored in memory cells, included in a data cell area 121*a* and the shared area 121*b*, from among memory cells connected to a word line WLn. Two bits (e.g., "01") of the write data W_Data of "110101" are selected as the shared data S_Data to be stored in the shared area 121*b*.

Reference dedicated data RD_Data is generated based on the shared data S_Data. For example, the reference dedicated data RD_Data may be generated in various manners according to the ratio of logical '0' and logical '1' of reference cells for generating a reference signal. If the ratio of logical '0' to logical '1' for generation of a reference signal is 1:1, the reference dedicated data RD_Data may be an inverted version of the shared data S_Data. If the shared data S_Data is "01", encoding is performed such that the reference dedicated data RD_Data is "10".

When data stored in memory cells connected to the word line WLn is read, a reference signal is generated using memory cells of the shared area 121*b* in which data of "r3r2" is stored and memory cells of the reference cell area 121*c* in which data of "r1r0" is stored. That is, a reference signal for sensing is generated based on selected memory cells of the shared area 121*b* where the ratio of logical '0' to logical '1' is 1:1 and selected memory cells of the reference cell area 121*c* where the ratio of logical '0' to logical '1' is 1:1. Write data W_Data of "110101" stored in the data cell array 121*a* and the shared area 121*b* is sensed based on the generated reference signal.

The number of reference cells used to form the reference cell area 121*c* may be reduced by using the shared area 121*b*. The reference dedicated data RD_Data corresponding to shared data S_Data stored in the share data 121*b* is freely encoded without a limit on code words.

Figure 6:
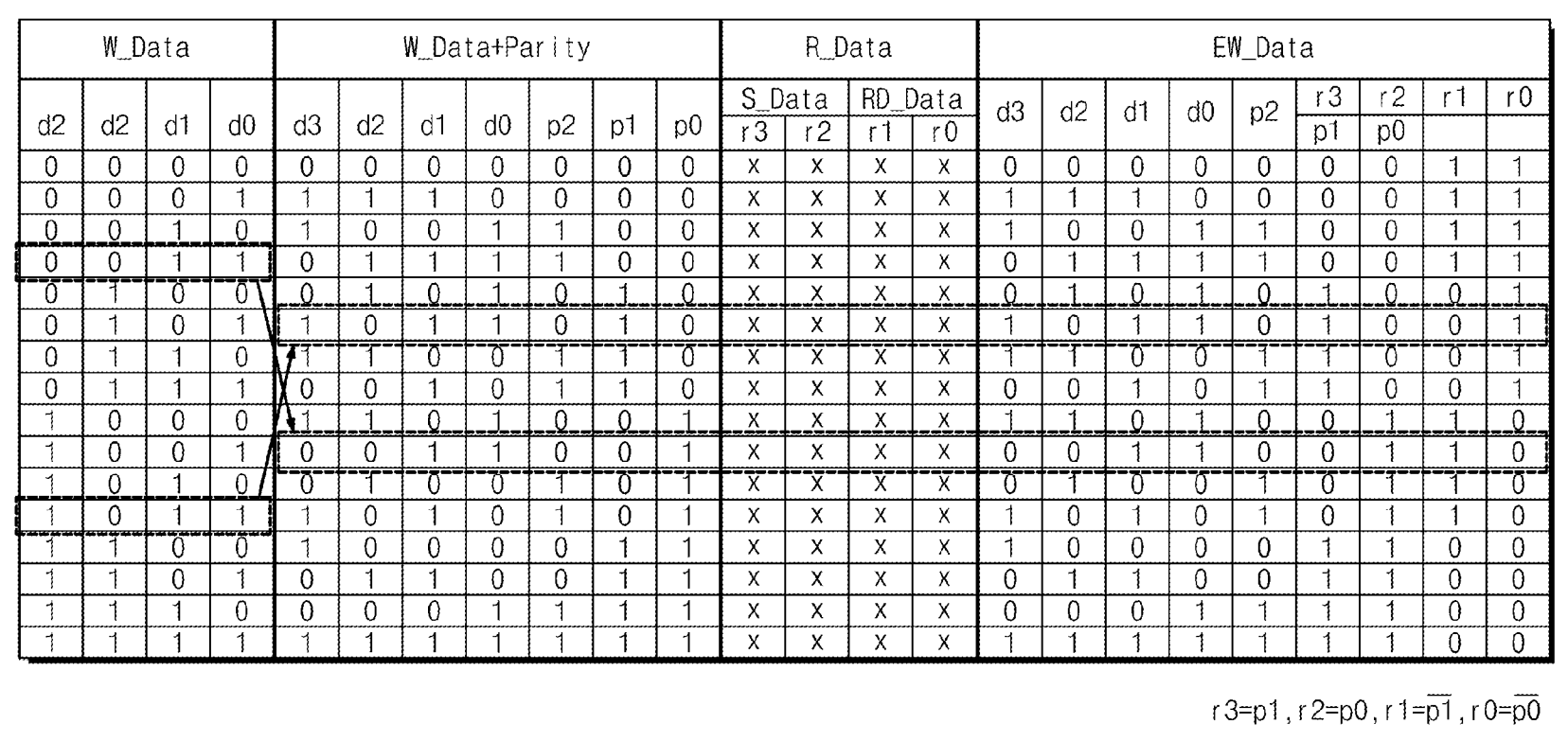

FIGS. 5 and 6 show true tables for describing an example embodiment of FIG. 4. An encoding method of reference data R_Data when write data W_Data is 3-bit data and shared data S_Data is 1-bit data is described with reference to FIG. 5. An encoding method of reference data R_Data when write data W_Data is 4-bit data and shared data S_Data is 3-bit data is described with reference to FIG. 6.

Referring to FIG. 5, there is schematically illustrated an encoding operation of the 2-bit reference data R_Data on the 3-bit write data W_Data. The 2-bit reference data R_Data includes 1-bit shared data S_Data and 1-bit reference dedicated data RD_Data. A part of write data W_Data is selected as the reference data R_Data for free encoding of which the encoding freedom of the reference data R_Data is high. Reference dedicated data RD_Data is obtained by inverting the shared data S_Data.

An illustrative example is given below where the write data W_Data is "110". In this case, a least significant bit (LSB) (i.e., logical '0') of the write data is selected as 1-bit shared data S_Data. The 1-bit shared data S_Data of "0" corresponds to a most significant bit (MSB) (i.e. 'r1') of the reference data R_Data. Encoding is performed such that the LSB of the reference data R_Data is set to logical '1' which is an inverted version of the shared data S_Data. Thus, encoded write data EW_Data of "1101" is generated by processing the write data W_Data of "110" according to a reference encoding method. Eight encoded write data values respectively corresponding to eight write data values are output.

Referring to FIG. 6, there is shown an example embodiment in which a reference encoding method according to an example embodiment of the inventive concepts is applied to the (7, 4) hamming code where 3-bit parity data for error correction is added to 4-bit write data W_Data. In addition, it is assumed that the number of reference data bits is 4 to secure data integrity. 4-bit reference data R_Data includes 2-bit shared data S_Data and 2-bit reference dedicated data RD_Data.

An illustrative example is given below where the write data W_Data of "0011" is received. In this case, a parity check bit value (hereinafter, referred to as parity) for single error correction and dual error detection on message data of "0011" is "001". 7-bit combination data W_Data+Parity is generated by combining 4-bit write data W_Data and 3-bit parity. Encoding is performed such that 4-bit reference data R_Data is generated from the 7-bit combination data of "0011001". First, there is selected 2-bit shared data S_Data of the combination data W_Data+Parity.

For example, lower bits of "01" of the combination data W_Data+Parity are selected as the shared data S_Data. The shared data S_Data of "01" correspond to upper bits r3r2 of the reference data R_Data. A lower bit r1 of the 4-bit reference data R_Data has a logic value corresponding to an inverted version of the upper bit r3, and a lower bit r0 of the 4-bit reference data R_Data has a logic value corresponding to an inverted version of the upper bit r2. Thus, the reference dedicated data RD_Data is "10". Encoded write data EW_Data of "001100110" is generated by processing the write data W_Data of "0011" according to a reference encoding method.

As another illustrative example, encoded write data EW_Data of "101101001" is generated by processing the write data W_Data of "'1011'" according to a reference encoding method. Encoded write data EW_Data on 16 cases on write data W_Data are shown in FIG. 6. Here, a reference bit (r3=p1) and a reference bit r0 is an inverted version of a reference bit (r2=p0). However, the inventive concepts are not limited thereto. It is possible to variously set correspondence between bits of shared data S_Data and bits of reference dedicated data RD_Data.

Figure 7:
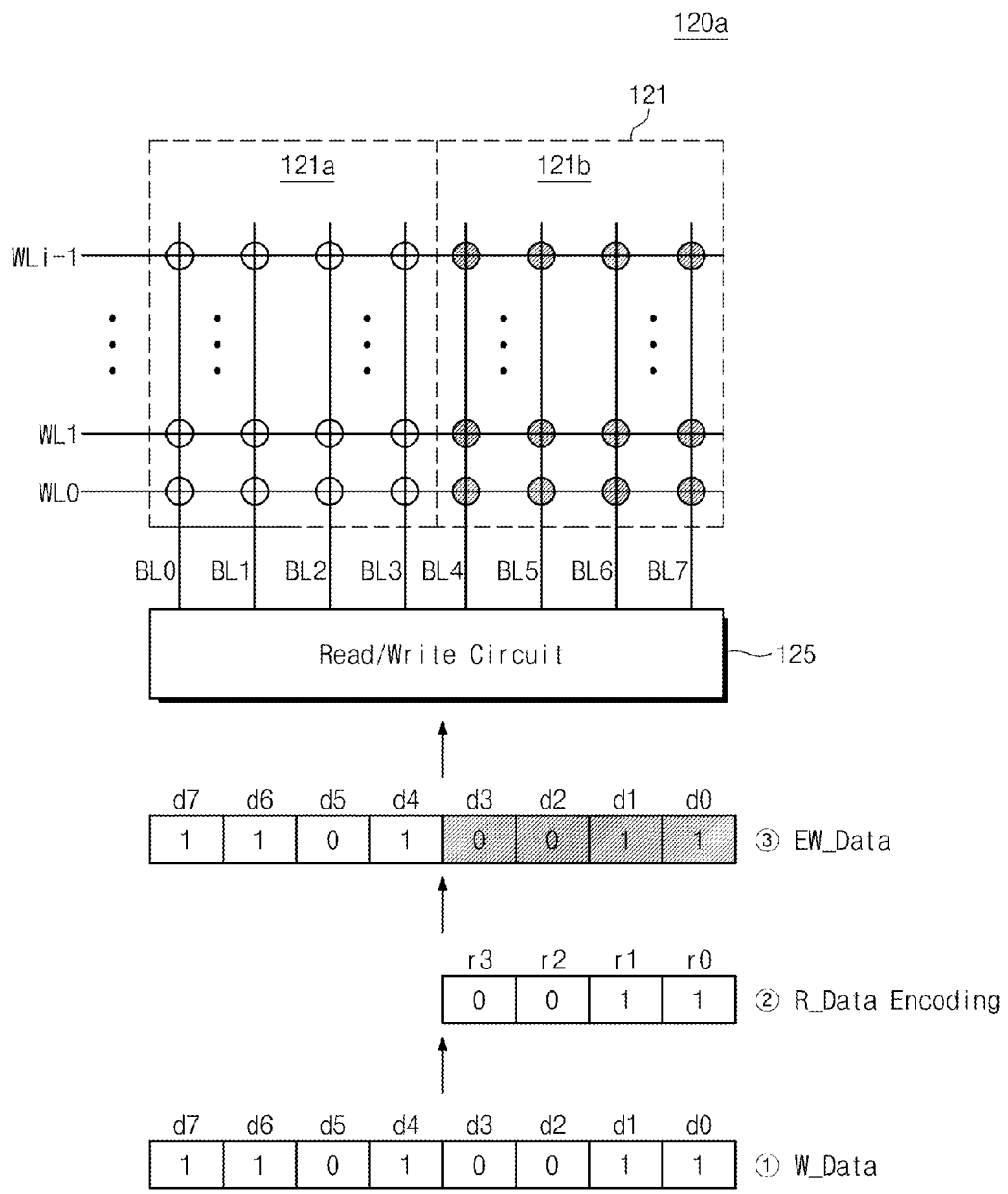
FIG. 7 is a block diagram schematically illustrating a data writing method according to another example embodiment of the inventive concepts.

FIG. 7 is a block diagram schematically illustrating a data writing method according to another embodiment of the inventive concepts.

Referring to FIG. 7, all reference cells in a nonvolatile memory device 120a may be used as memory cells to store write data W_Data. In other words, a part of memory cells in a data area for storing the write data W_Data may be used as reference cells.

A cell array 121 includes a data cell area 121a and a reference cell area 121b. A part of the write data W_Data is stored in the data cell area 121a. The rest of the write data W_Data is stored in the reference cell area 121b. That is, the reference cell area 121b is used to store a part of the write data W_Data and to provide a cell signal for generating a reference signal. The reference signal is generated based on cell signals provided through bit lines BL4 and BL7 of the reference cell area 121b. A reference level for reading data stored in the data cell area 121a and the reference cell area 121b is decided according to the reference signal.

Data is stored in the cell array 121 according to the following process.

In operation 1, the write data W_Data is provided from an external device. In the below discussed example it is assumed that the write data W_Data is 8-bit data of "11010011".

Then, in operation 1, a part of the write data W_Data is selected as data to be stored in the reference cell area 121b and a determination is made as to whether the selected data (e.g., "0011") satisfies a condition for storing it in the reference cell area 121b. There is required that logical '0' and logical '1' are stored in reference cells for providing data integrity according to a desired (or, alternatively, a predetermined) ratio (e.g., 1:1). Whether data selected from the write data W_Data is suitable to be stored in the reference cell area 121b is evaluated in consideration of the ratio of logical values to be stored in the reference cells.

When data selected from the write data W_Data is suitable to be stored in the reference cell area 121b, it is decided as shared data S_Data. When data selected from the write data W_Data is not suitable to be stored in the reference cell area 121b, encoding on the selected data is additionally performed. That is, the selected data is encoded to have a bit ratio suitable for the reference cell area 121b. However, it is assumed that the selected data has a ratio suitable to be stored in the reference cell area 121b. That is, the selected data is formed of two logical '0' bits and two logical '1' bits. Thus, the selected data has qualification for the shared data S_Data.

When the selected data, that is, partial data selected from the write data W_Data coincides with a reference condition, the write data W_Data is written in a selected memory area without separate encoding on the write data W_Data (③). When the selected data, that is, partial data selected from the write data W_Data does not coincide with the reference condition, the shared data S_Data is generated through separate encoding.

As described above, input write data W_Data is stored in the data cell area 121a and the reference cell area 121b. Memory cells in the reference cell area 121b are used both as reference cells and as memory cells to store data. This data storing method is applicable to memory areas such as One Time Programmable (OTP) areas. Specific codes are often formed of an iterative pattern. When the specific codes are stored in reference cells, the reference cells are used as reference cells and as data cells during a read operation.

Figure 8:
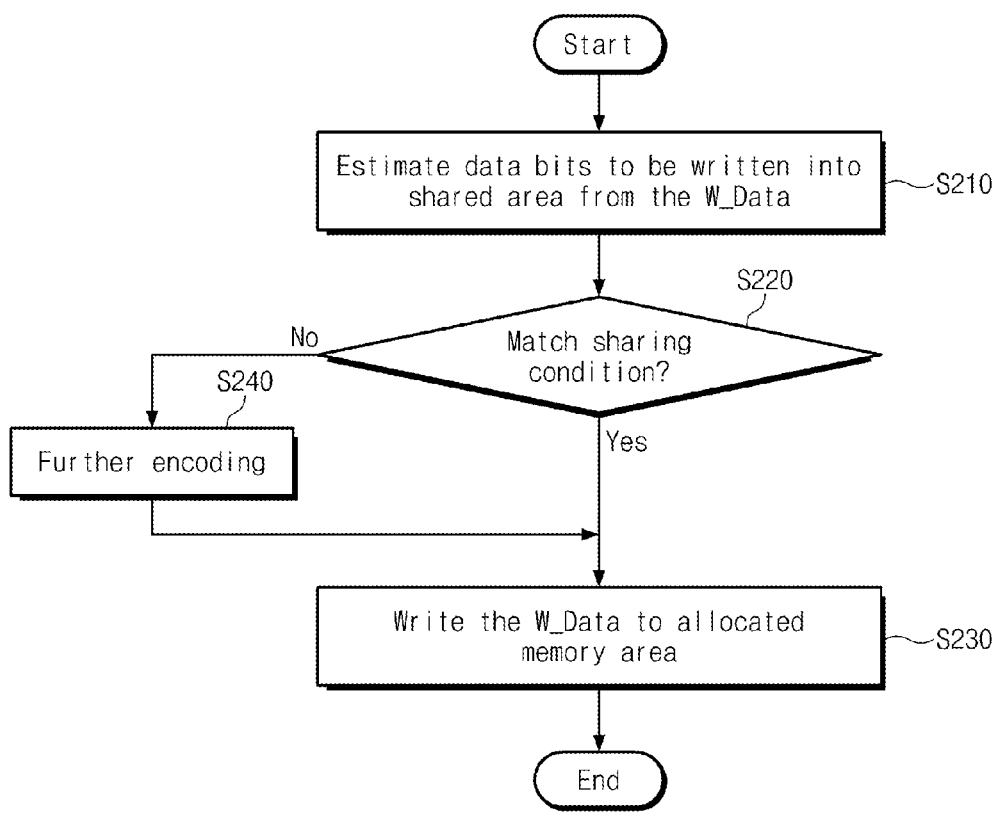
FIG. 8 is a flow chart schematically illustrating an encoding method of FIG. 7, according to an example embodiment of the inventive concepts.

FIG. 8 is a flow chart schematically illustrating an encoding method of FIG. 7, according to an example embodiment of the inventive concepts.

Referring to FIG. 8, the reference encoder 115 (refer to FIG. 1) may operate when write data W_Data is received from an external device.

In operation S210, the reference encoder 115 determines whether data, selected as data to be stored in a reference cell area 121b, from among the write data W_Data is suitable for shared data S_Data. In this case, the reference encoder 115 selects a part of the write data W_Data as data to be stored in the reference cell area 121b.

In operation S220, the reference encoder 115 detects the ratio of logical '1' to logical '0' included in the selected data of the write data W_Data to be stored in the reference cell area 121b. If the ratio of logical '1' to logical '0' satisfies a sharing condition, the method proceeds to step S230. If the ratio of logical '1' to logical '0' does not satisfy the sharing condition, the method proceeds to step S240.

In operation S230, the write data W_Data is stored in the data cell array 121a and the reference cell area 121b without separate modification, if the sharing condition is satisfied.

In operation S240, data, allocated to the reference cell area 121b, from among the write data W_Data is further encoded if the data, allocated to the reference cell area 121b, from among the write data W_Data does not satisfy the sharing condition. That is, the ratio of logical '1' and logical '0' included in the selected data of the write data W_Data does not satisfy a reference. The further encoding may include various operations such as shifting, inverting, etc. However, flag information directing that reference data is generated through the further encoding may be generated to be used during a read operation. If the further encoding ends, the method proceeds to operation S230 in which the write data W_Data is stored in the data cell array 121a and the reference cell area 121b.

Figure 9:
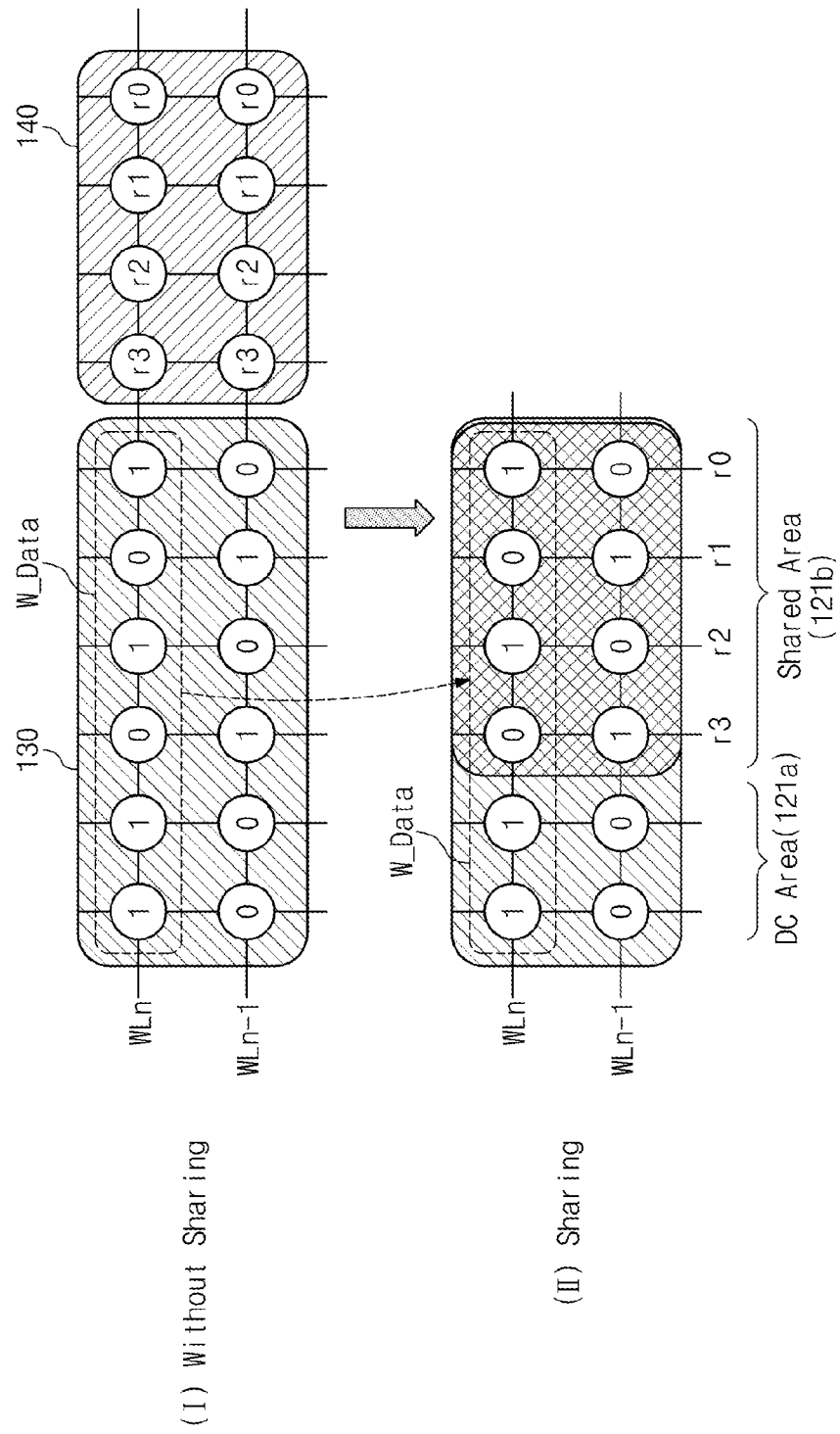
FIG. 9 is a diagram schematically illustrating a data writing method according to another example embodiment of the inventive concepts.

FIG. 9 is a diagram schematically illustrating a data writing method according to another example embodiment of the inventive concepts.

Referring to FIG. 9, a shared area 121b in which a part of write data W_Data is stored may have a data storage function and a reference cell function. In addition, the shared area 121b is formed of reference cells, and the write data W_Data is stored in the reference cells belonging to the shared area 121b.

Referring to a first case (I), there is shown an example of a data cell area 130 and reference cell area 140 when a shared area 121b does not exist. In this case, the data cell area 130 is physically separated from the reference cell area 140. The reference cell area 140 formed of reference cells does not have a function of storing message data capable of being input and output. The message data is stored only in the data cell area 130. For example, write data W_Data of "110101" is stored in memory cells, included in the data cell area 130, from among memory cells connected to a word line WLn. Reference data of "r3r2r1r0" is stored in reference cells of the reference cell area 140 connected to the word line WLn.

Here, the reference data of "r3r2r1r0" is not related to the write data W_Data of "110101". The reference data of "r3r2r1r0" may be stored during a write operation on the data area 130. Or, the reference data of "r3r2r1r0" may be set to fixed values.

Referring to a second case (II), there is shown a result of a data writing method according to another embodiment of the inventive concepts. If there is determined whether a part of the write data W_Data is suitable to be stored in a shared area 121*b* as shared data S_Data, the write data W_Data is stored in a selected memory area. For example, the write data W_Data of "110101" is stored in memory cells, included in the data cell area 121*a* and the shared area 121*b*, from among memory cells connected to the word line WLn. At this time, "11" of the write data W_Data of "110101" is stored in the data cell area 121*a* and "0101" of the write data W_Data of "110101" is stored in the shared area 121*b*. The "0101" of the write data W_Data of "110101" stored in the shared area 121*b* is used as message data and as reference data corresponding to an optimal state of reference cells.

Cells in the shared area 121*b* are used as reference cells. Also, the cells in the shared area 121*b* provide a function of storing data of "0101". There is described an example embodiment where data stored in the shared area 121*b* has a reference data condition. However, the inventive concepts are not limited thereto. When data stored in the shared area 121*b* does not satisfy the reference data condition, arrangement or a bit ratio may be modified or changed through further encoding.

As described above, message data having a reference condition is stored in reference cells using the shared area 121*b*. Thus, the reference cells have both a function of providing a reference signal for data sensing and a data storage function. This may mean that a cost for implementing reference cells is reduced.

FIG. 10 is a block diagram schematically illustrating a data writing method according to another embodiment of the inventive concepts.

Referring to FIG. 10, a memory controller 110 receives first write data W_Data1 and second write data W_Data2. A reference encoder 115 (refer to FIG. 1) generates reference data R_Data that is shared by the first write data W_Data1 and the second write data W_Data2.

First, in operation 1, the first write data W_Data1 and the second write data W_Data2 are received. In the illustrative example, it is assumed that the first write data W_Data1 is 6-bit data of "110101" and the second write data W_Data2 is 6-bit data of "100101".

In operation 2, encoding is performed such that reference data R_Data is generated according to bits, to be stored in the shared area 121*b*, from among the first write data W_Data1 and the second write data W_Data2. That is, "c1c0" (i.e., "01") of the first write data W_Data1 is selected as data to be stored in the shared area 121*b*, and "d1d0" (i.e., "01") of the second write data W_Data2 is selected as data to be stored in the shared area 121*b*. It is understood that "c1c0" (i.e., "01") of the first write data W_Data1 selected as data to be stored in the shared area 121*b* is equal to "d1d0" (i.e., "01") of the second write data W_Data2 selected as data to be stored in the shared area 121*b*. In this case, upper bits "r3r2" of reference data R_Data may be "01", and lower bits "r1r0" thereof may be "10".

In operation 3, if the reference data R_Data is generated, upper bits "c5c4c3c2" of the first write data W_Data1, upper bits "d5d4d3d2" of the second write data W_Data2 and the reference data "r3r2r1 r0" are merged to generate encoded write data EW_Data. The encoded write data EW_Data is stored in a data cell area 121*a*, a shared area 121*b* and a reference cell area 121*c*.

Figure 11:
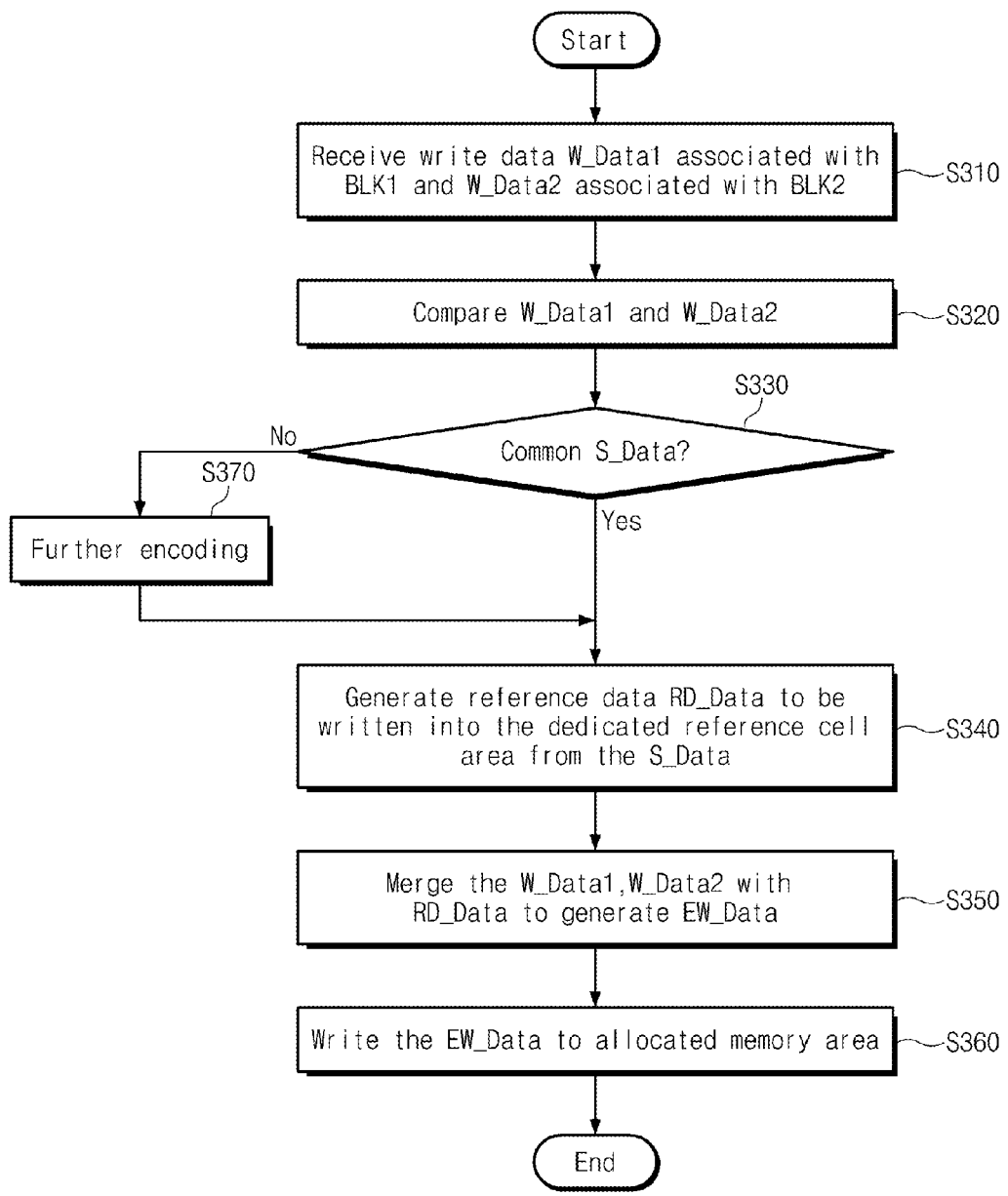
FIG. 11 is a flow chart schematically illustrating a write method of a nonvolatile memory device according to another example embodiment of the inventive concepts.

FIG. 11 is a flow chart schematically illustrating a write method of a nonvolatile memory device according to another example embodiment of the inventive concepts.

Referring to FIG. 11, a write operation may commence when first and second write data W_Data1 and W_Data2 is provided from an external device or a host (not shown).

In operation S310, the memory controller 110 (refer to FIG. 1) receives the first and second write data W_Data1 and W_Data2. Here, the first write data W_Data1 is data to be stored in a memory block BLK1, and the second write data W_Data2 is data to be stored in a memory block BLK2. Locations where the first and second write data W_Data1 and W_Data2 is stored may be decided by detecting input addresses.

In operation S320, the reference encoder 115 (refer to FIG. 1) compares the first write data W_Data1 and the second write data W_Data2. In particular, the reference encoder 115 compares shared data S_Data, allocated to a shared area 121*b*, from among the first write data W_Data1 and shared data S_Data, allocated to the shared area 121*b*, from among the second write data W_Data2.

In operation S330, when the shared data S_Data of the first write data W_Data1 is equal to the shared data S_Data of the second write data W_Data2, the method proceeds to operation S340. On the other hand, when the shared data S_Data of the first write data W_Data1 is not equal to the shared data S_Data of the second write data W_Data2, the method proceeds to operation S370.

In operation S340, the reference encoder 115 generates reference dedicated data RD_Data to be stored in a reference cell area 121*c* based on the shared data S_Data. For example, the reference dedicated data RD_Data generated by inverting the shared data S_Data may satisfy a reference condition of the whole reference data R_Data. The reference dedicated data RD_Data may be generated by XORing the shared data S_Data and medium data. Here, the medium data may be data that has logical '1' bits the number of which is equal to that of the shared data S_Data.

In operation S350, the rest of the first write data W_Data1 other than the shared data S_Data, the rest of the second write data W_Data2 other than the shared data S_Data, and the reference data R_Data are merged to generate the encoded write data EW_Data.

In operation S360, the encoded write data EW_Data is written in a cell array 121. That is, the rest of the first write data W_Data1 other than the shared data S_Data and the rest of the second write data W_Data2 other than the shared data S_Data are stored in the data cell area 121*a*. The shared data S_Data is stored in the shared area 121*b*, and the reference dedicated data RD_Data is stored in the reference cell area 121*c*.

If the shared data S_Data of the first write data W_Data1 is not equal to the shared data S_Data of the second write data W_Data2, in step S370, further encoding is performed. The further encoding is more fully described below. Data is stored in the cell array 121 without loss of the shared data S_Data of each of the first and second write data W_Data1 and W_Data2 through the further encoding. If the further encoding ends, the method proceeds to step S340.

Figure 12:
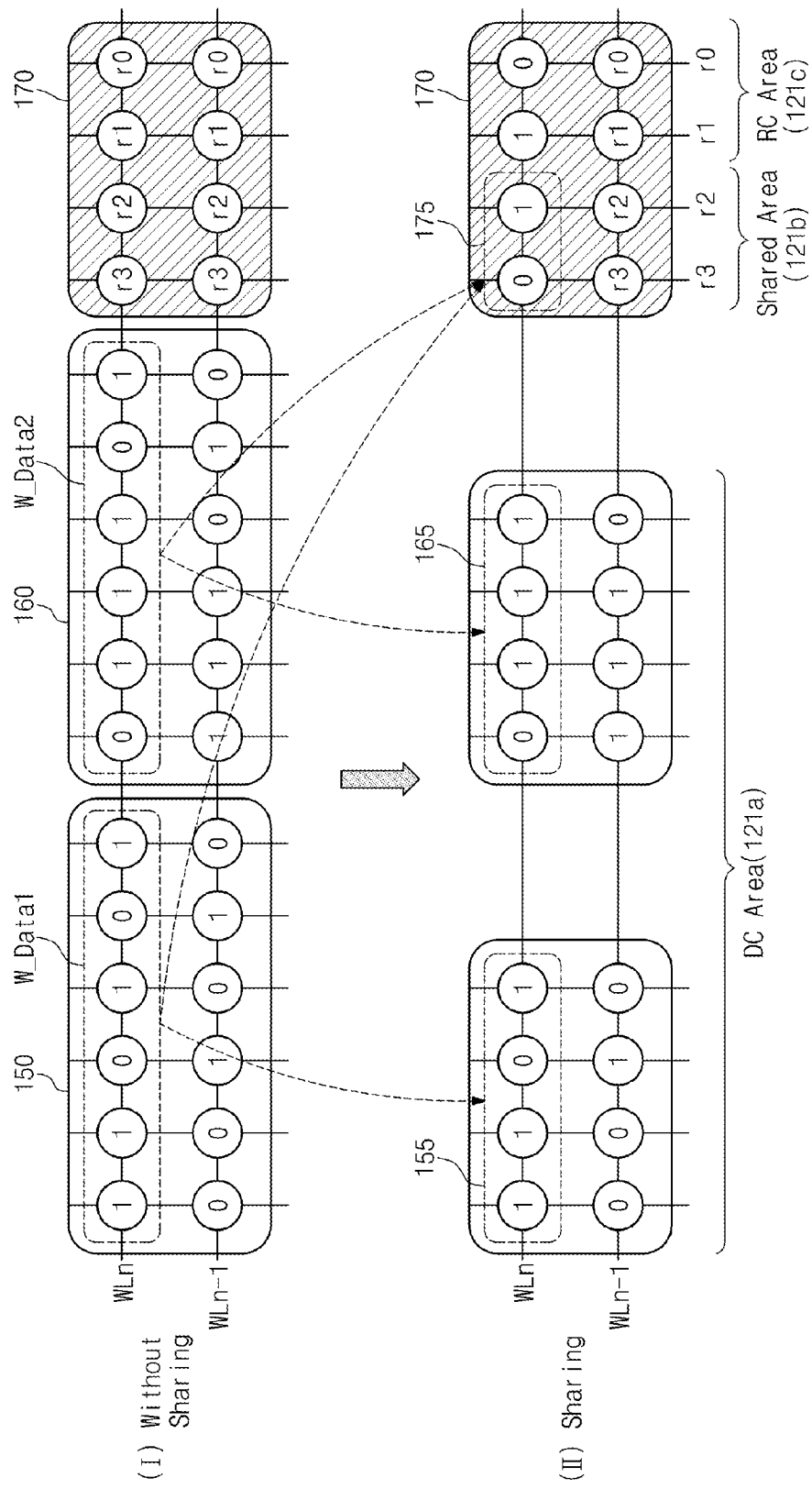
FIG. 12 is a diagram schematically illustrating a data writing method according to another example embodiment of the inventive concepts.

FIG. 12 is a diagram schematically illustrating a data writing method according to another example embodiment of the inventive concepts.

In FIG. 12, there is illustrated how first and second write data W_Data1 and W_Data2 is rearranged on a cell array according an encoding method according to an example embodiment of the inventive concepts.

Referring to a first case (I), there is illustrated an example in which a data cell area and a reference cell area are not shared. The first write data W_Data1 is stored in a memory block 150, and the second write data W_Data2 is stored in a memory block 160. A reference cell area 170 includes reference cells for providing a reference signal on the memory blocks 150 and 160. Here, reference data "r3r2r1r0" is stored in reference cells connected to a word line WLn. The reference data "r3r2r1r0" is not related to the first and second write data W_Data1 and W_Data2. A separate chip area for reference cells is required since data cells and reference cells are not shared. More reference cells are required to secure data integrity. This causes an increase in a chip area.

Referring to a second case (II), there is illustrated an example embodiment in which reference cells are used as data cells. In particular, a data bit stored in a reference cell is shared by a plurality of data groups. That is, first write data W_Data1 is formed by combining shared data of "01" (refer to a reference numeral 175) stored in a shared area 121b and data of "1101" (refer to a reference numeral 155) stored in a data cell area 121a. Second write data W_Data2 is formed by combining the shared data of "01" (refer to a reference numeral 175) stored in the shared area 121b and data of "0111" (refer to a reference numeral 165) stored in the data cell area 121a.

In an example embodiment, data stored in reference cells may be shared by a plurality of write data groups. When write data including the same pattern of bits is stored in different memory blocks, the same pattern of bits is stored in the shared area 121b. The same pattern of bits stored in the shared area 121b satisfies a reference cell condition and is used as message data.

FIGS. 13 to 16 are diagrams schematically illustrating a further encoding method of FIG. 11, according to an example embodiment of the inventive concepts. In FIGS. 13 to 16, there is described an encoding method performed when shared data selected from first write data A is different from that selected from second write data B.

Figure 13:
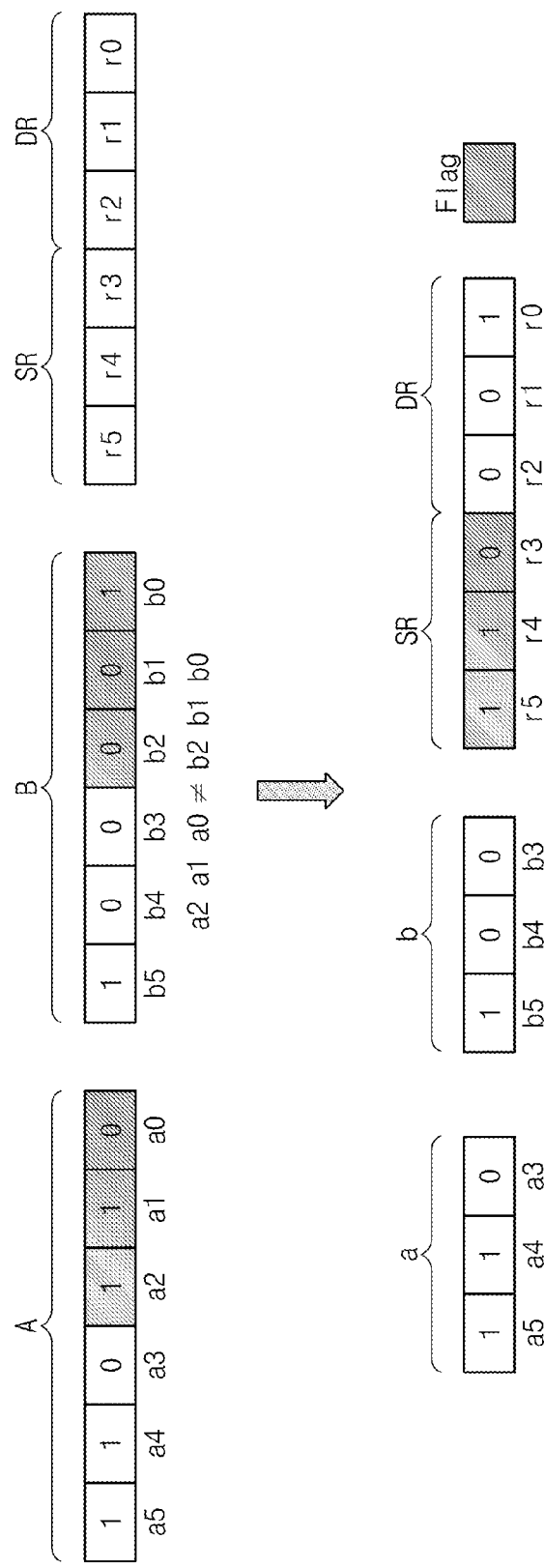
FIGS. 13 to 16 are diagrams schematically illustrating a further encoding method of FIG. 11, according to an example embodiment of the inventive concepts.

Referring to FIG. 13, it is understood that data selected from the first write data A is different from that selected from the second write data B. Upper bits "a5a4a3" of the first write data Are stored in a data cell area 121a, and lower bits "a2a1a0" thereof is stored in a shared area 121b. Upper bits "b5b4b3" of the second write data B is stored in the data cell area 121a, and lower bits "b2b1b0" thereof is stored in the shared area 121b.

The lower bits of the first write data A and the lower bits of the second write data B are bit strings not shared. For example, a bit string of the lower bits "a2a1a0" of the first write data A is "110", while a bit string of the lower bits "b2b1b0" of the second write data B is "001". In this case, the lower bits "110" of the first write data A are stored in the shared area 121b as shared data SR. On the other hand, when the second write data B is written, the upper bits "100" of the second write data B are stored in the data cell area 121a, and flag information on the shared data SR is stored in a specific area. The flag information is used to indicate that a lower bit of the second write data B is an inverted version of the shared data SR. An upper bit string b stored in the data cell area 121a, the shared data SR and flag information are read to read the second write data B.

Figure 14:
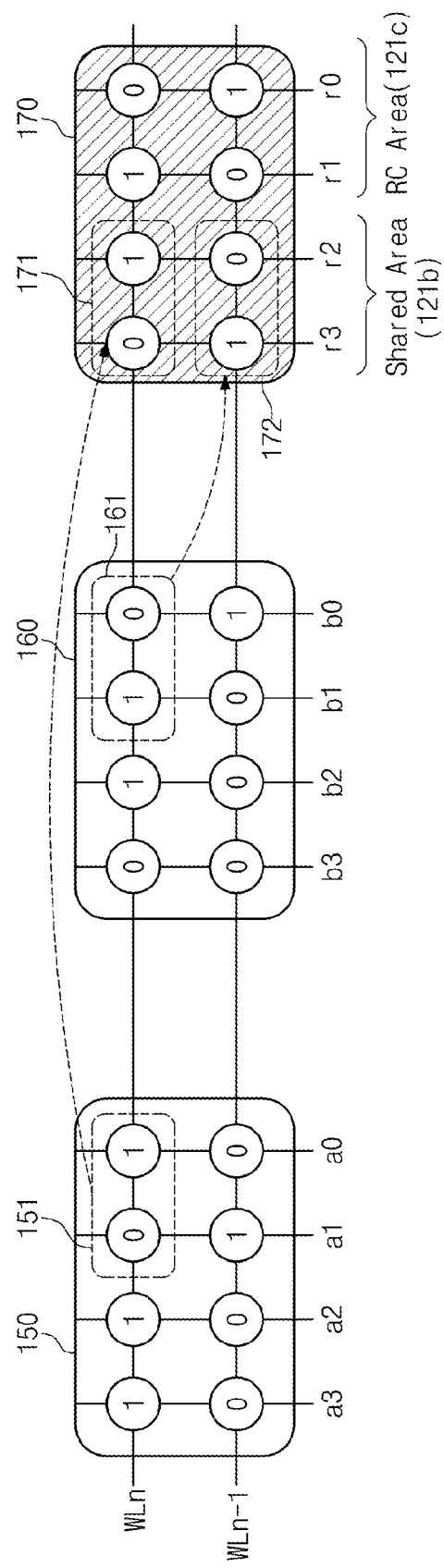

FIG. 14 is a diagram schematically illustrating a further encoding method according to another example embodiment of the inventive concepts. In FIG. 14, there is illustrated an example embodiment in which shared bits "a1a0" of first write data "a3a2a1a0" is different from shared bits "b1b0" of second write data "b3b2b1b0".

Although not shown, upper bits "a3a2" of the first write data "a3a2a1a0" and upper bits "b3b2" of the second write data "b3b2b1b0" are stored in a data cell area 121a. The lower bits "a1a0" of the first write data "a3a2a1a0" are stored in reference cells 171 of a shared area 121b connected to a word line WLn. The lower bits "b1b0" of the second write data "b3b2b1b0" are stored in reference cells 172 of the shared area 121b. A word line WLn−1 connected to the reference cells 172 is different from a word line WLn connected to the reference cells 171. When a first part, corresponding to data to be stored in the shared area 121b, from among first data is different from a second part, corresponding to data to be stored in the shared area 121b, from among second data, the encoding freedom is improved by mapping the first part and the second part onto different word lines. In this case, flag information indicating that the first part and the second part are mapped onto different word lines is further provided.

Figure 15:
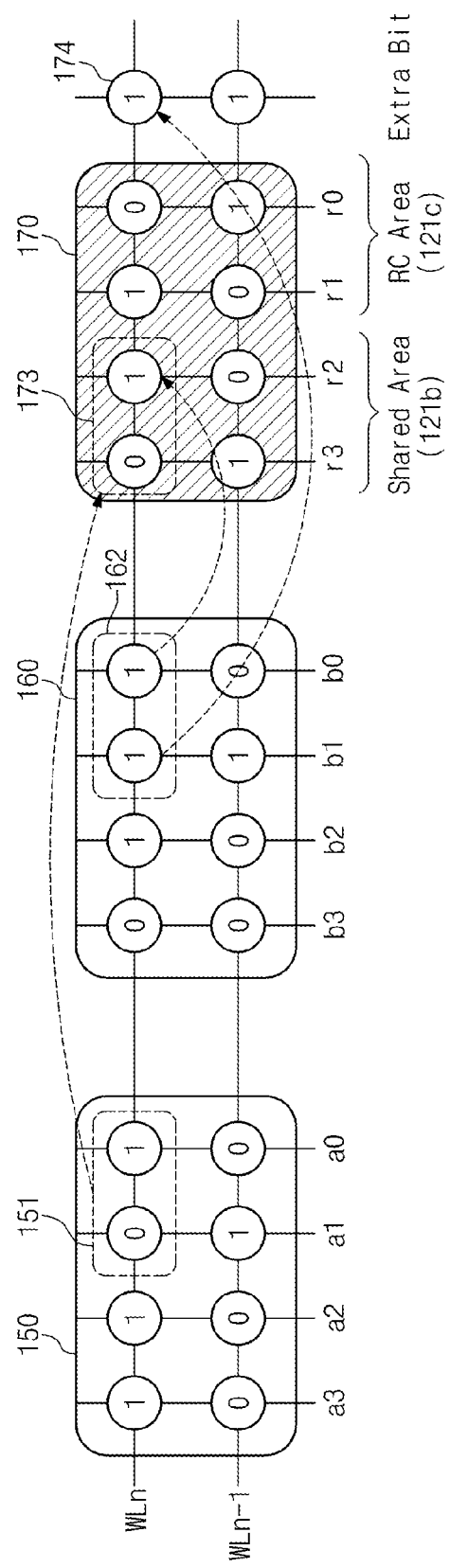

FIG. 15 is a diagram schematically illustrating a further encoding method according to still another example embodiment of the inventive concepts. In FIG. 15, there is illustrated an example embodiment in which shared bits "a1a0" of first write data "a3a2a1a0" is different from shared bits "b1b0" of second write data "b3b2b1b0".

Although not shown, upper bits "a3a2" of the first write data "a3a2a1a0" and upper bits "b3b2" of the second write data "b3b2b1b0" are stored in a data cell area 121a through reference encoding. The lower bits "a1a0" of the first write data "a3a2a1a0" are stored in reference cells 173 of a shared area 121b connected to a word line WLn. On the other hand, the lower bit "b0" of the second write data "b3b2b1b0" is stored in a reference cell 173 of the shared area 121b, and the lower bit "b1" thereof is stored in an extra cell 174. In this case, flag information indicating a location of the lower bit "b1" of the second write data "b3b2b1b0" is further provided.

Figure 16:
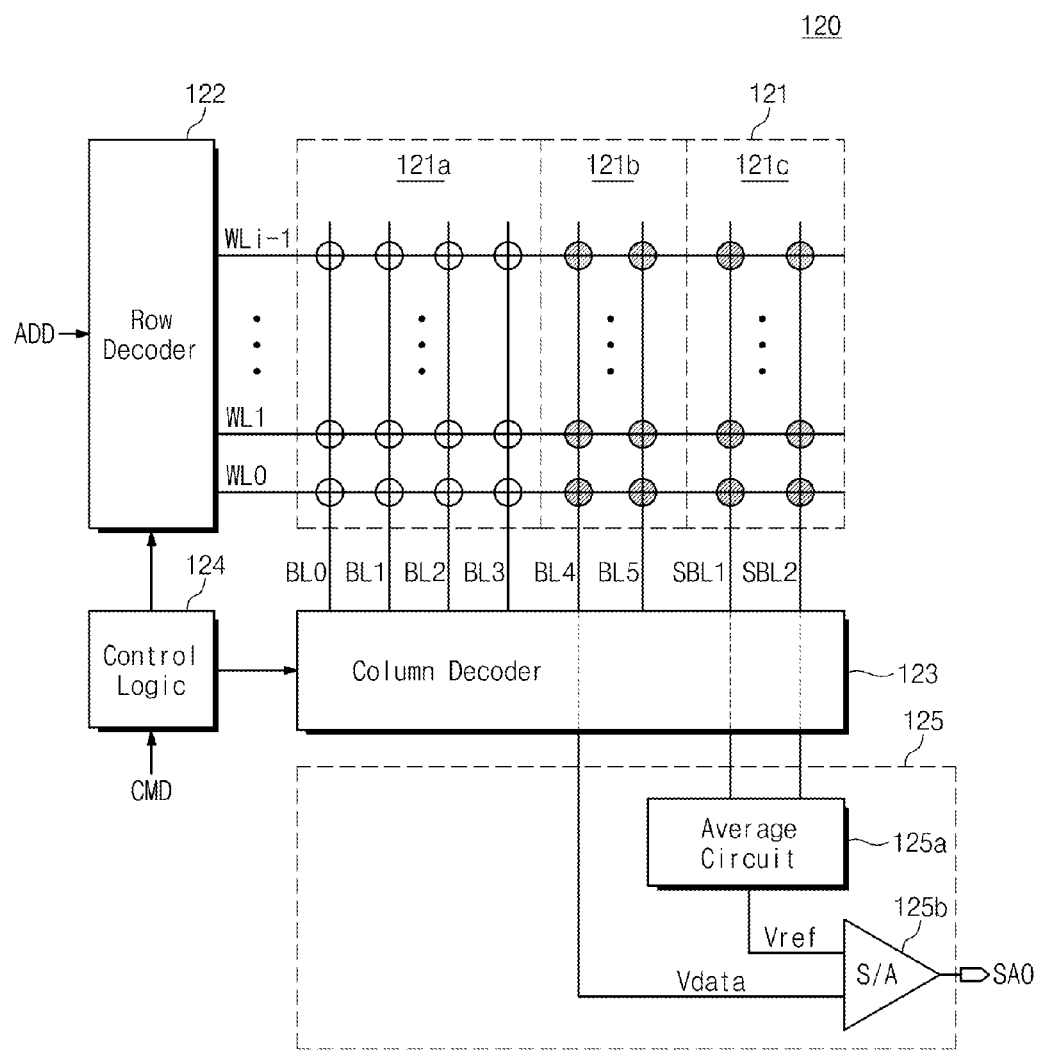

FIG. 16 is a block diagram schematically illustrating a bit line selection structure for a read operation of a nonvolatile memory according to an example embodiment of the inventive concepts.

Referring to FIG. 16, a nonvolatile memory device 120 includes the cell array 121, a row decoder 122, a column decoder 123, control logic 124, an average circuit 125a, and a sense amplifier 125b. Here, the average circuit 125a and the sense amplifier 125b constitute the read/write circuit 125.

During a read operation, memory cells included in the shared area 121b are selected by the column decoder 123 to provide message data stored therein. For example, a sensing voltage Vdata is transferred to the sense amplifier 125b through a bit line BL4 connected to memory cells included in the shared area 121b. In addition, reference cells included in a reference cell area 121c are connected to the average circuit 125a through bit lines SBL1 and SBL2. The average circuit 125a generates a reference voltage Vref based on signals from the reference cells. The sense amplifier 125b compares the reference voltage Vref and the sensing voltage Vdata to decide data stored in a selected memory cell in the shared area 121b.

Figure 17:
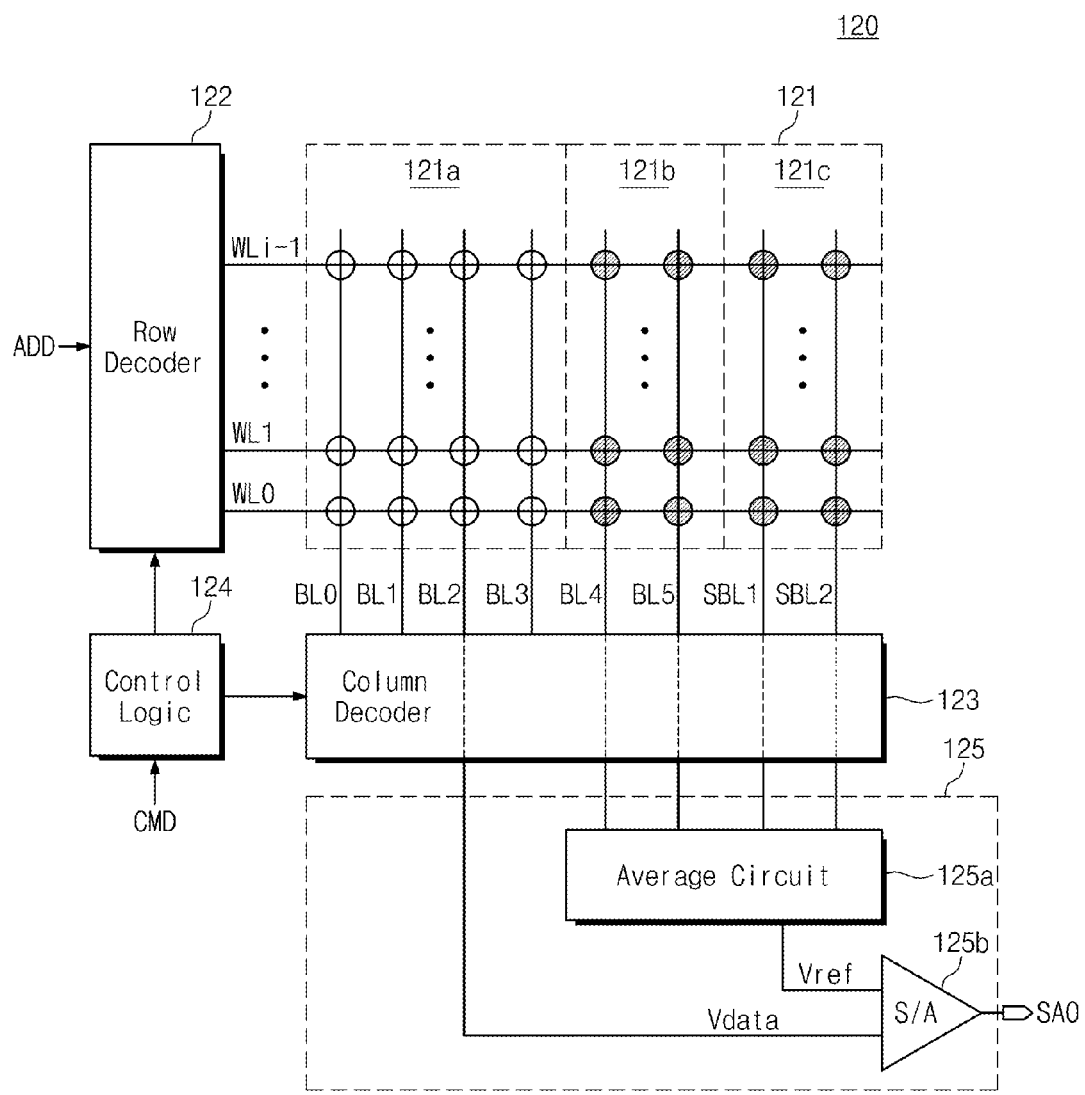
FIG. 17 is a block diagram schematically illustrating a read operation of a nonvolatile memory according to another embodiment of the inventive concept.

FIG. 17 is a block diagram schematically illustrating a read operation of a nonvolatile memory according to another example embodiment of the inventive concepts. A structure of a nonvolatile memory device 120 in FIG. 17 is the same as that in FIG. 16, and a description thereof is thus omitted.

During a read operation, a bit line (e.g., BL2) of a data cell area 121a is selected to sense data stored in the data cell area 121a, so that a sensing voltage Vdata is provided to a sense amplifier 125b. In addition, bit line voltages of memory cells of a shared area 121b and a reference cell area 121c are provided to an average circuit 125a. The average circuit 125a generates a reference voltage Vref from memory cells of the shared area 121b and the reference cell area 121c. The sense amplifier 125b compares the reference voltage Vref and the sensing voltage Vdata to decide data stored in a selected memory cell in the shared data cell area 121a.

According to read methods described with reference to of FIGS. 16 and 17, memory cells included in the shared area 121b have a function of storing data provided from an external device and a reference cell function. Thus, it is possible to reduce a chip area for the reference cell area 121c.

Figure 18:
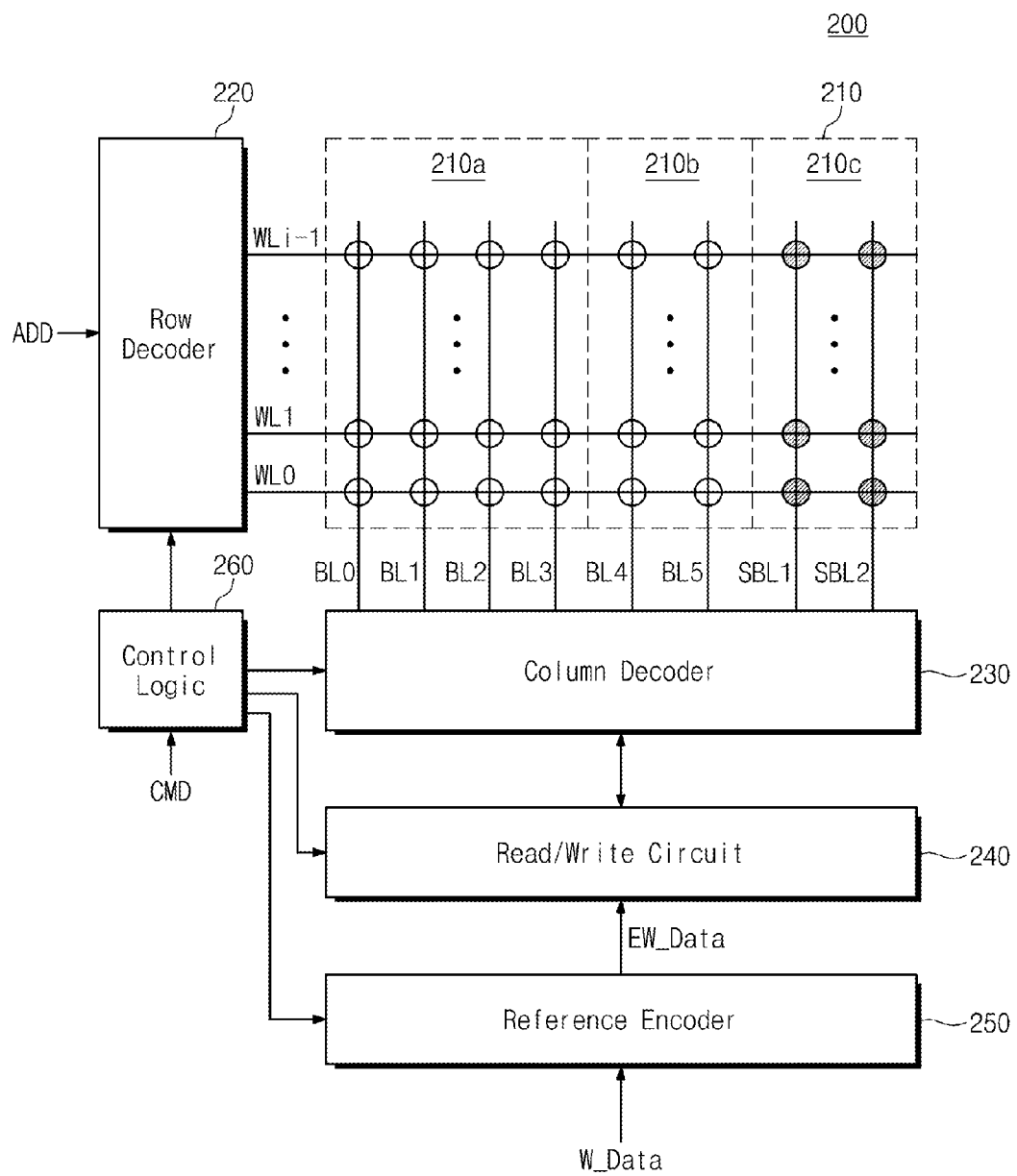
FIG. 18 is a block diagram schematically illustrating a nonvolatile memory device according to an example embodiment of the inventive concepts.

FIG. 18 is a block diagram schematically illustrating a nonvolatile memory device according to an example embodiment of the inventive concepts.

Referring to FIG. 18, a nonvolatile memory device 200 includes a reference encoder 250 configured to perform reference encoding on write requested data.

The cell array 210 includes memory cells having the same arrangement and configuration as those of a nonvolatile memory device 120 described with reference to FIG. 1. The cell array 210 includes a data cell area 210a, a shared area 210b, and a reference cell area 210c. Shared data S_Data of encoded write data EW_Data and an original message portion other than reference dedicated data RD_Data are stored in the data cell area 210a. The shared data S_Data of the encoded write data EW_Data is stored in the shared area 210b. The reference dedicated data RD_Data is stored in the reference cell area 210c.

During a read operation, a reference signal is generated using memory cells, included in the shared area 210b and the reference cell area 210c, from among memory cells connected to a selected word line. Memory cells included in the data cell area 210a and the shared area 210b are sensed based on the reference signal.

A row decoder 220 selects a word line in response to an address ADD. A column decoder 230 selects a bit line according to a control of control logic 260. The column decoder 230 selects bit lines for generating a reference signal at the selected word line. At this time, bit lines selected from bit lines of the shared area 210b and the reference cell area 210c may be connected to an average circuit to generate a reference signal. On the other hand, the column decoder 230 selects bit lines bit lines corresponding to the data cell area 210a and the shared area 210b to sense data. Here, a bit line selecting operation for generating a reference signal and a bit line selecting operation for sensing data may be performed independently. Or, a bit line selecting operation for generating a reference signal and a bit line selecting operation for sensing data may be performed at the same time.

A read/write circuit 240 stores encoded write data EW_Data provided from the reference encoder 240 in the areas 210a, 210b and 210c. Also, the read/write circuit 240 senses memory cells of a selected area. Although not shown, the read/write circuit 240 may include the average circuit for generating a reference signal through selected bit lines. Also, the read/write circuit 240 may further include a sense amplifier for sensing data stored in a memory cell of the data cell area 210a or the shared area 210b based on the reference signal from the average circuit.

The reference encoder 250 encodes input write data W_Data to output the encoded write data EW_Data. The reference encoder 250 generates reference dedicated data RD_Data allocated to the reference cell area 210c, based on shared data, allocated to the shared area 210b, from among the write data W_Data. The reference encoder 250 merges the reference dedicated data RD_Data and the write data W_Data to generate the encoded write data EW_Data.

The control logic 260 controls the row decoder 220, the column decoder 230, the read/write circuit 240, the reference encoder 250, etc. in response to a command and control signals from an external device.

Figure 19:
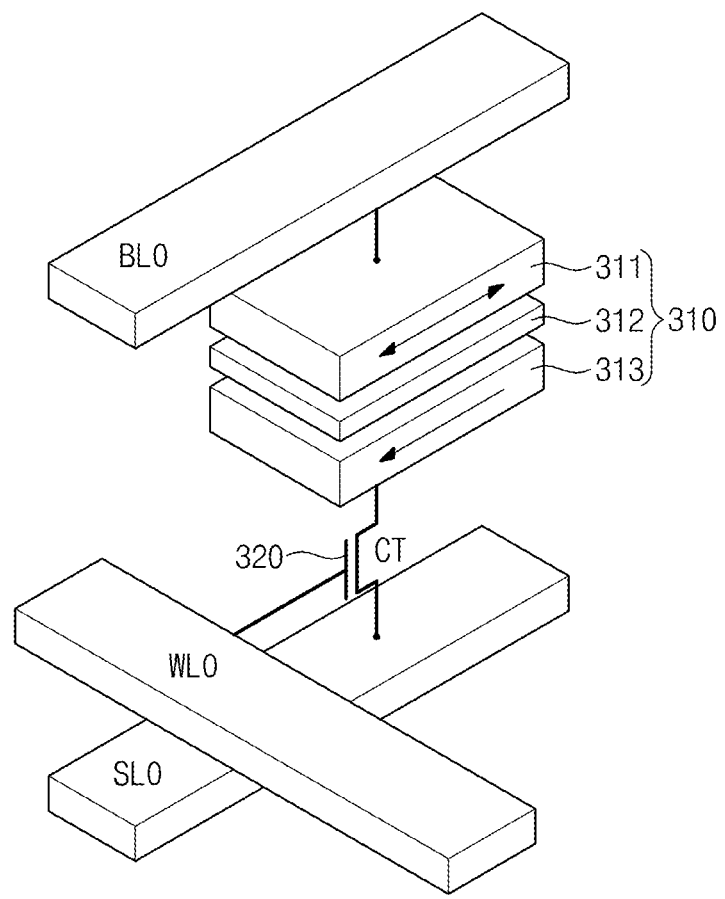
FIGS. 19 to 21 are diagrams illustrating a memory cell included in a nonvolatile memory device according to an example embodiment of the inventive concepts.
Figure 20:
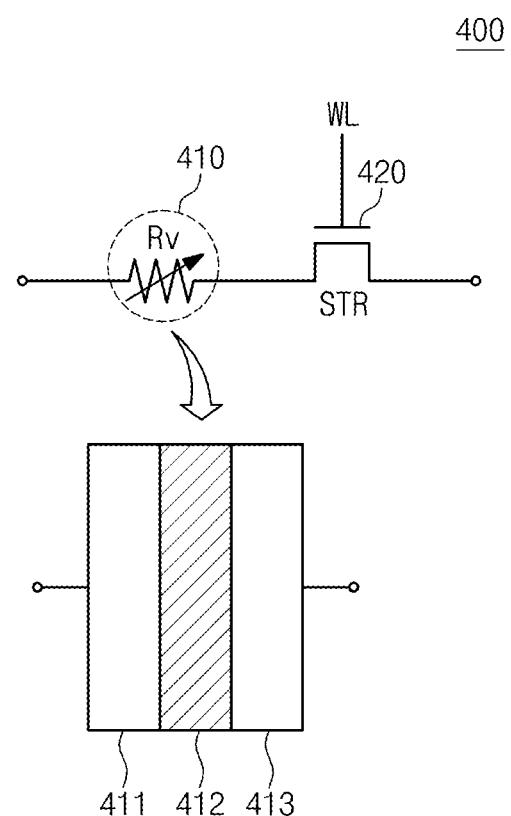
Figure 21:
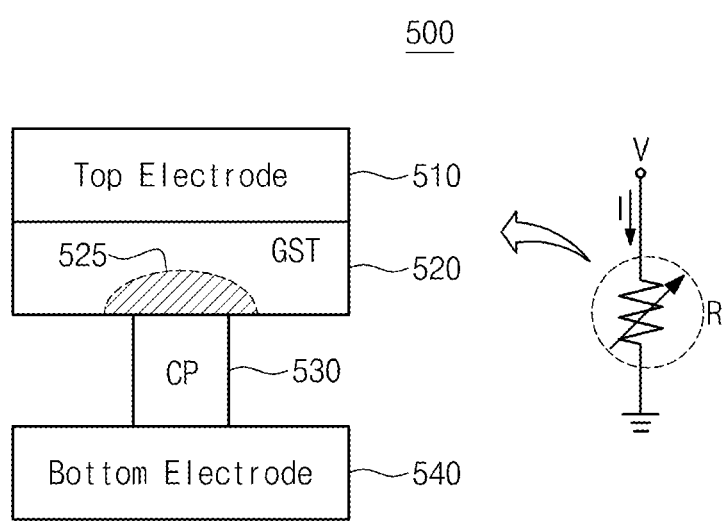

FIGS. 19 to 21 are diagrams illustrating a memory cell included in a nonvolatile memory device according to an example embodiment of the inventive concepts.

Referring to FIG. 19, a memory cell 300 of a STT-MRAM (Spin Transfer Torque Magneto resistive Random Access Memory) is illustrated as a memory cell of a nonvolatile memory device 120 or 200. The memory cell 300 includes a magnetic tunnel junction (MTJ) element 310 and a cell transistor (CT) 320. A gate of the cell transistor 320 is connected to a word line WL0. One end of the cell transistor 320 is connected to a bit line BL0 through the MTJ element 310. The other end of the cell transistor 320 is connected to a source line SL0.

The MTJ element 310 includes a pinned layer 313, a free layer 311, and a tunnel layer 312 interposed between the pinned layer 313 and the free layer 311. A magnetization direction of the pinned layer 313 may be fixed, and a magnetization direction of the free layer 311 may be equal to or opposite to that of the pinned layer 313 according to a condition. An anti-ferromagnetic layer (not shown) may be further provided to fix a magnetization direction of the pinned layer 313.

During a write operation of the memory cells 300 of the STT-MRAM, a voltage is applied to the word line WL0 to turn on the cell transistor 320, and a write current is applied between the bit line BL0 and the source line SL0. During a read operation of the memory cells 300 of the STT-MRAM, data stored at the MTJ element 310 is determined according to a resistance value measured by applying a turn-on voltage to the word line WL0 to turn on the cell transistor 320 and applying a read current in a direction from the bit line BL0 to the source line SL0.

FIG. 20 is a circuit diagram illustrating a memory cell of a resistive memory device according to an example embodiment of the inventive concepts.

Referring to FIG. 20, a memory cell 400 of a resistive memory device includes a variable resistance element 410 and a selection transistor 420.

The variable resistance element 410 includes a variable resistance material for storing data. The selection transistor 420 selectively supplies a current to the variable resistance element 410 according to a bias of a word line WL. As illustrated in FIG. 20, the selection transistor 420 may be formed of an NMOS transistor. However, the selection transistor 420 may be formed of one of switch elements such as a PMOS transistor, a diode, etc.

The variable resistance element 410 includes a pair of electrodes 411 and 413 and a data storage film 412 interposed between the electrodes 411 and 413. The data storage film 412 may be formed of a bipolar resistance storage substance or a unipolar resistance storage substrate. The bipolar resistance storage substance may be programmed to a set or reset state according to a pulse polarity. The unipolar resistance storage substrate may be programmed to a set or reset state by a pulse having the same polarity. The unipolar resistance storage substrate may include a single transition metal oxide such as $NiO_x$ or $TiO_x$. The bipolar resistance storage substance may include a pervoskite material.

FIG. 21 is a diagram schematically illustrating a phase change memory device as an example of a nonvolatile memory device according to an example embodiment of the inventive concepts.

Referring to FIG. 21, a memory cell 500 of a phase change memory device is formed of a resistive element R and a switching element (not shown). A resistance value of the resistive element R is varied according to a current I applied to the resistive element R. The resistive element R is formed of a top electrode 510, a phase change material 520, a contact plug 530, and a bottom electrode 540. The top electrode 510 is connected to a bit line. The bottom electrode 540 is connected between the contact plug 530 and an access transistor or an access diode (not shown). The contact plug 530 is formed of a conductive material (e.g., TiN, etc.) and is referred to as a heater plug. The phase change material 520 is formed between the top electrode 510 and the contact plug 530. A phase of the phase change material 520 is varied according to amplitude, duration, fall time, etc. of a current pulse supplied. A phase of the phase change material 520 corresponding to a set or a reset is decided by an amorphous volume 525. For example, an amorphous phase corresponds to a reset state, and a crystal phase corresponds to a set state. The amorphous volume decreases when a phase of the phase change material 520 switched from the amorphous state to the crystal state. A resistance value of the phase change material 520 is varied according to the amorphous volume 525 formed. That is, data to be written is decided according to the amorphous volume 525 of the phase change material 520 formed according to different current pulses.

STT-MRAM, PRAM and RRAM cells are schematically described as a memory cell of a nonvolatile memory device. However, the memory cell of the nonvolatile memory device is not limited to this disclosure. For example, the memory cell may be formed of one of a flash memory cell, a FRAM cell, a DRAM cell, etc.

Figure 22:
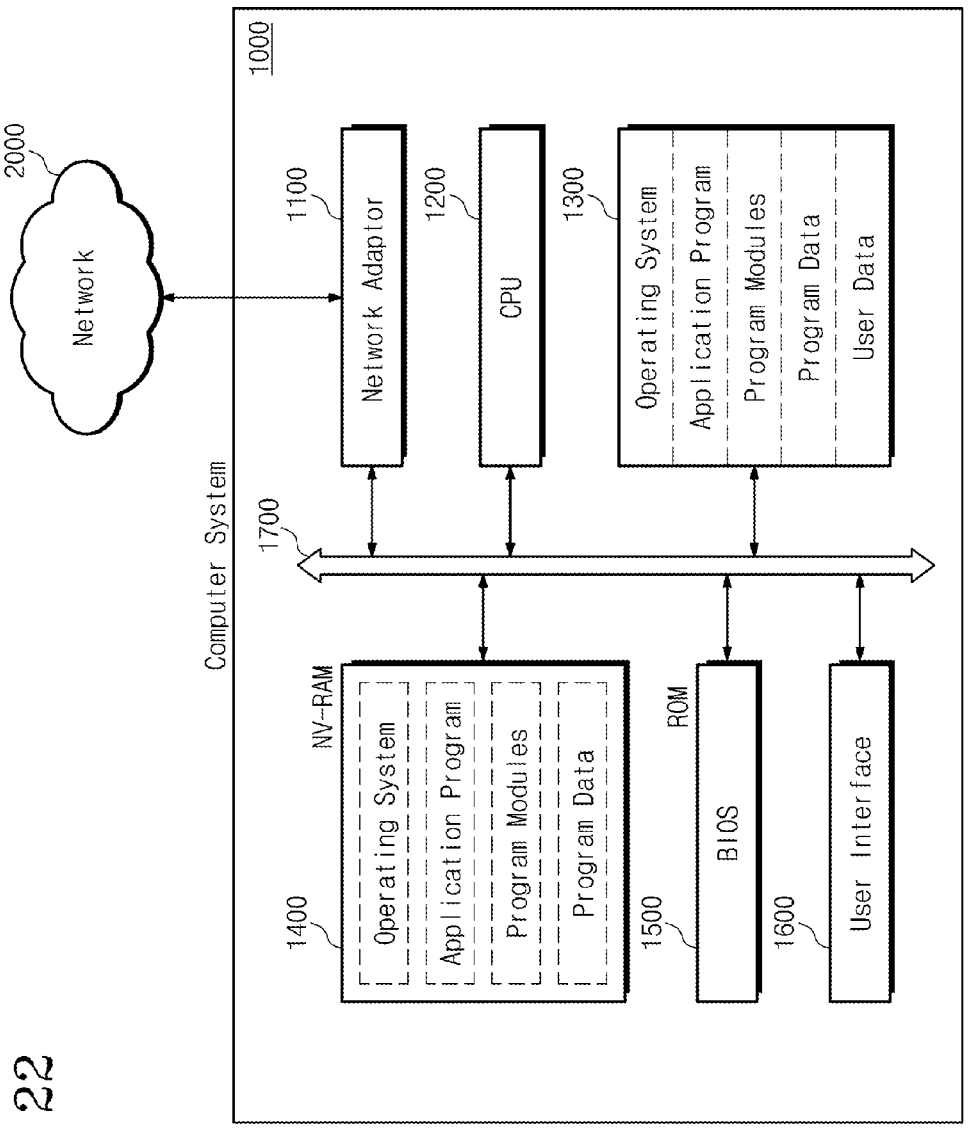
FIG. 22 is a block diagram illustrating a computer system according to an example embodiment of the inventive concepts.

FIG. 22 is a block diagram illustrating a computing system according to an example embodiment of the inventive concept.

Referring to FIG. 22, a computing system 1000 includes a network adaptor 1100, a CPU 1200, a large-capacity storage device 1300, a nonvolatile RAM 1400, a ROM 1500, and a user interface 1600 that are electrically connected to a system bus 1700.

The network adaptor 1100 provides an interface between the computing system 1000 and external networks 2000. The CPU 1200 controls an overall operation for driving an operating system and an application program which are resident on the nonvolatile RAM 1400. The large-capacity storage device 1300 stores data needed for the computing system 1000. For example, the large-capacity storage device 1300 may store an operating system for driving the computing system 1000, an application program, various program modules, program data, user data, and so on.

The nonvolatile RAM 1400 is used as a working memory of the computing system 1000. During a booting operation, the operating system, the application program, the various program modules, and program data needed to drive programs and various program modules read out from the large-capacity storage device 1300 may be loaded on the nonvolatile RAM 1400. The ROM 1500 stores a basic input/output system (BIOS) which is activated before the operating system is driven upon booting. Information exchange between the computing system 1000 and a user is made via the user interface 1600.

In addition, the computing system 1000 may further include a battery, a modem, etc. Although not shown in FIG. 22, the computing system 1000 may further include an application chipset, a camera image processor (CIS), a mobile DRAM, and the like.

The large-capacity storage device 1300 may be formed of HDD or hybrid HDD. In addition, the large-capacity storage device 1300 may be formed of a solid state drive (SSD), an MMC card, an SD card, a micro SD card, a memory stick, an ID card, a PCMCIA card, a chip card, a USB card, a smart card, a CF card, and so on.

In the computing system 1000 according to an example embodiment of the inventive concepts, the nonvolatile RAM 1400 reduces the number of reference cells while maintaining high data integrity. The nonvolatile RAM 1400 according to an example embodiment of the inventive concepts is provided as a mass and high-reliability working memory.

In some example embodiments, a nonvolatile RAM and/or a memory controller may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concepts have been described with reference to example embodiments, it will be apparent to those skilled in the art that various changes and modifications may be made without departing from the spirit and scope of the example embodiments. Therefore, it should be understood that the above embodiments are not limiting, but illustrative.

What is claimed is:

1. A data management method of a nonvolatile memory device which includes a data cell area and a reference cell area, comprising:
selecting shared data from write data input to the memory device;
generating reference data based on the shared data;
storing a first portion of the write data in the data cell area and a second portion of the write data in a first reference area of the reference cell area; and
storing the reference data in a second reference area of the reference cell area.

2. The data management method of claim 1, wherein the generating of the reference data comprises:
encoding the reference data according to respective bits of the shared data such that the reference data has logical values satisfying a reference cell condition.

3. The data management method of claim 2, wherein the shared data is a number of a least significant bits of the write data, the number of bits corresponding to a size of the first reference area.

4. The data management method of claim 2, wherein the generating the reference data comprises:
inverting respective bits of the shared data to generate the reference data.

5. The data management method of claim 1, wherein selecting the shared data comprises:
selecting the shared data according to a column address corresponding to the first reference area.

6. The data management method of claim 1, further comprising:
merging the write data and the reference data to generate encoded write data corresponding to a write unit.

7. The data management method of claim 1, further comprising:

generating a reference signal for sensing the write data from memory cells of the first and second reference areas.

8. The data management method of claim 7, further comprising:
sensing memory cells of the first reference area and the data cell area based on the reference signal.

9. The data management method of claim 1, wherein the data cell area and the reference cell area comprise:
at least one of Magnetic Random Access Memory (MRAM) cells, Phase change Random Access Memory (PRAM) cells, and Resistive Random Access Memory (RRAM) cells.

10. A data management method of a nonvolatile memory device which includes a data cell area and a reference cell area, comprising:
selecting shared data from write data input to the memory device; and
storing the write data in the data cell area and the reference cell area,
wherein the number of bits of the write data is equal to a sum of the number of memory cells of the data cell area and the number of memory cells of the reference cell area.

11. The data management method of claim 10, wherein the shared data is at least the two least significant bits of the write data corresponding to a size of the reference cell area.

12. The data management method of claim 11, wherein the selecting the shared data comprises:
selecting the shared data according to a column address corresponding to the reference cell area.

13. The data management method of claim 10, further comprising:
generating a reference signal for sensing the write data from memory cells in which the shared data is stored.

14. The data management method of claim 13, further comprising:
sensing memory cells of the data cell area or the reference cell area, in which the write data is stored, based on the reference signal.

15. The data management method of claim 10, further comprising:
determining whether the shared data satisfies a sharing condition; and
storing the shared data in the reference cell area, if the shared data satisfies the sharing condition.

16. A method for managing data of a memory device, the method comprising:
receiving, at the memory device, an instruction from a memory controller instructing the memory device to store write data therein; and
storing the write data in the memory cells of the memory device such that a portion of the write data stored in each of the memory cells associated with a shared cell area of the memory device represents both the received write data and reference data.

17. The method of claim 16, further comprising:
reading the write data from the memory device; and
determining a logical level of the write data based on an amount of current flowing through the shared cell area having the reference data stored therein.

18. The method of claim 17, wherein at least two bits stored in the shared cell area represent both the write data received from the memory controller and the reference data used to determine the logical level of the write data.

19. The method of claim 16, wherein the storing the portion of the write data in the shared cell area comprises:
selecting a number of least significant bits of the write data corresponding to a size of the shared cell area as test reference data; and
generating the reference data from the test reference data such that logical values stored therein satisfy a desired condition.

20. The method of claim 16, further comprising:
generating a reference signal from the reference data by providing the reference data to an averaging circuit; and
determining a logical level of the write data by comparing, using a sense amplifier, a voltage level of the reference signal and a voltage level associated with the write data.

* * * * *